(12) United States Patent
Hiura et al.

(10) Patent No.: US 8,980,217 B2
(45) Date of Patent: Mar. 17, 2015

(54) METHOD OF MANUFACTURING GRAPHENE SUBSTRATE, AND GRAPHENE SUBSTRATE

(75) Inventors: Hidefumi Hiura, Tokyo (JP); Kazuhito Tsukagoshi, Ibaraki (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/995,809

(22) PCT Filed: Nov. 25, 2011

(86) PCT No.: PCT/JP2011/077879
§ 371 (c)(1),
(2), (4) Date: Jun. 19, 2013

(87) PCT Pub. No.: WO2012/086387
PCT Pub. Date: Jun. 28, 2012

(65) Prior Publication Data
US 2013/0272951 A1    Oct. 17, 2013

(30) Foreign Application Priority Data

Dec. 21, 2010    (JP) .................. 2010-284021

(51) Int. Cl.
*C01B 31/02*    (2006.01)
*H01L 21/02*    (2006.01)
*H01L 29/16*    (2006.01)
(Continued)

(52) U.S. Cl.
CPC ...... *H01L 21/02527* (2013.01); *H01L 21/0237* (2013.01); *H01L 21/02573* (2013.01); *H01L 21/02612* (2013.01); *H01L 21/02656* (2013.01); *H01L 29/1606* (2013.01); *H01L 21/02491* (2013.01); *C01B 31/0446* (2013.01); *H01L 29/66742* (2013.01); *H01L 29/78603* (2013.01); *H01L 29/78684* (2013.01); *B82Y 30/00* (2013.01); *B82Y 40/00* (2013.01); *Y10S 977/775* (2013.01)
USPC .......................................... 423/448; 977/775

(58) Field of Classification Search
CPC ................................... C01B 31/0446
USPC ............................. 423/448; 977/775; 257/29
See application file for complete search history.

(56) References Cited

U.S. PATENT DOCUMENTS

2009/0110627 A1    4/2009   Choi et al.
2010/0038629 A1*   2/2010   Lazarev .......................... 257/29

(Continued)

FOREIGN PATENT DOCUMENTS

JP    2009-107921 A    5/2009
JP    2009-200177 A    9/2009

(Continued)

OTHER PUBLICATIONS

Ago, H. et al. "Patterned Growth of Graphene over Epitaxial Catalyst". small 2010, 6, No. 11, 1226-1233.*

(Continued)

*Primary Examiner* — Richard M Rump
(74) *Attorney, Agent, or Firm* — Sughrue Mion, PLLC

(57) ABSTRACT

Provided is a graphene substrate, which is manufactured by: bringing a metal layer into contact with a carbon-containing layer and heating the metal layer to dissolve carbon in the carbon-containing layer into the metal layer; and cooling the metal layer to precipitate the carbon in the metal layer as graphene on any substrate surface.

18 Claims, 8 Drawing Sheets

(51) Int. Cl.
*C01B 31/04* (2006.01)
*H01L 29/66* (2006.01)
*H01L 29/786* (2006.01)
*B82Y 30/00* (2011.01)
*B82Y 40/00* (2011.01)

(56) References Cited

U.S. PATENT DOCUMENTS

2010/0224851 A1* 9/2010 Colombo et al. ............ 257/9
2010/0255987 A1* 10/2010 Choi et al. .................. 502/416

FOREIGN PATENT DOCUMENTS

| | | |
|---|---|---|
| JP | 2010-037128 A | 2/2010 |
| WO | 2010/110153 A1 | 9/2010 |
| WO | 2010/122928 A1 | 10/2010 |

OTHER PUBLICATIONS

Direct Growth of Bilayer Graphene on SiO2 Substrates by Carbon Diffusion through Nickel Zhiwei Peng, Zheng Yan, Zhengzong Sun, and James M. Tour ACS Nano 2011 5 (10), 8241-8247.*

Graphene-Based Nanoarchitectures. Anchoring Semiconductor and Metal Nanoparticles on a Two-Dimensional Carbon Support Prashant V. Kamat The Journal of Physical Chemistry Letters 2010 1 (2), 520-527.*

Camara, Nicolas, et al. "Selective epitaxial growth of graphene on SiC." Applied Physics Letters 93.12 (2008): 123503.*

Fujita, Jun-ichi, et al. "Fabrication of Large-Area Graphene Using Liquid Gallium and Its Electrical Properties." Japanese Journal of Applied Physics 49.6S (2010): 06GC01.*

Tsuneya Ando, "The electronic properties of graphene and carbon nanotubes", NPG asia materials, 2009, pp. 17-21, vol. 1, No. 1.

K.S. Novoselov, et al., "Two-dimensional atomic crystals", PNAS, Jul. 26, 2005, pp. 10451-10453, vol. 102, No. 30.

Xuesong Li, "Large-Area Synthesis of High-Quality and Uniform Graphene Films on Copper Foils", Science, Jun. 7, 2009, pp. 1312-1314, vol. 324.

M. Kusunoki, et al., "A formation mechanism of carbon nanotube films on SiC (0001)", Applied Physics Letters, Jul. 24, 2000, pp. 531-533, vol. 77, No. 4.

Jun-Ichi Fujita, et al., "Graphitization at interface between amorphous carbon and liquid gallium for fabricating large area graphene sheets", Journal of Vacuum Science & Technology. Second Series. B, Nov./Dec. 2009, pp. 3063-3066, vol. 77, No. 4.

* cited by examiner

METHOD OF MANUFACTURING GRAPHENE SUBSTRATE, AND GRAPHENE SUBSTRATE

CROSS REFERENCE TO RELATED APPLICATIONS

This application is a National Stage of International Application No. PCT/JP2011/077879 filed Nov. 25, 2011, claiming priority based on Japanese Patent Application No. 2010-284021 filed Dec. 21, 2010, the contents of all of which are incorporated herein by reference in their entirety.

TECHNICAL FIELD

This invention relates to a method of manufacturing a graphene substrate involving growing graphene directly on an insulator to realize "Graphene on Insulator," which has not been achieved heretofore, and to a graphene substrate manufactured by the method. In particular, this invention relates to a method of manufacturing a graphene substrate, which can be applied to next-generation electronics, optoelectronics, and spintronics by virtue of its exceptional electronic physical properties and optical characteristics and excellent mechanical characteristics and chemical characteristics, and to a graphene substrate manufactured by the method.

BACKGROUND ART

The current information-oriented society is supported by semiconductor elements typified by a complementary metal-oxide semiconductor (CMOS) based on silicon. Hitherto, the silicon semiconductor industry has achieved miniaturization by continuously restricting a range of sizes to which a fine processing technology such as a lithography technology, an etching technology, or a film formation technology is applied from micrometers to several tens of nanometers to realize high integration and high performance concurrently.

In recent years, a thickness of a silicon layer serving as a semiconductor channel has been reaching an atomic layer level, and material and physical limits thereof have been pointed out.

Graphene is a two-dimensional atomic layer thin film having an extremely small thickness and is also stable chemically and thermodynamically. Graphene is a novel semiconductor material having a high potential to meet the demand. Excellent physical properties of graphene may be utilized to realize a new element excelling the existing elements in performance.

Graphene is obtained by taking out only one layer of graphite, which is a layered substance formed of only $sp^2$-hybridized carbon, and is a monatomic layer planar substance which is very robust against a chemical reaction and is also stable thermodynamically as described above.

Graphene has a structure of a honeycomb-like (pseudo-) two-dimensional sheet in which six-carbon rings each having a regular hexagon shape with a carbon atom being positioned at an apex are arranged without any gap, and has a carbon-carbon distance of about 1.42 angstroms (0.142 nm), and a layer thickness of 3.3 to 3.4 angstroms (0.33 to 0.34 nm) in the case where an underlying base is graphite and about 10 angstroms (1 nm) in the case where an underlying base is a substrate other than graphite.

Regarding a size of a graphene plane, various sizes from a molecular size of a nanometer order to theoretically an infinite size can be assumed as a length of one piece of graphene.

In general, graphene refers to one layer of graphite, but includes two or more layers thereof in many cases.

In this case, graphene including one layer, graphene including two layers, and graphene including three layers are called monolayer graphene, bilayer graphene, and trilayer graphene, respectively, and graphenes including up to about 10 layers are collectively called few-layer graphene. Further, graphene other than the monolayer graphene is expressed as multi-layer graphene.

An electronic state of graphene can be described by a Dirac equation in a low-energy region (see Non Patent Literature 1). This point presents a marked contrast to electronic states of substances other than graphene, which can be well described by a Schrödinger equation.

Electron energy of graphene has a linear dispersion relation with respect to a wave number in the vicinity of a K-point, and more specifically, can be expressed by two straight lines having positive and negative slopes corresponding to a conduction band and a valence band. A point at which the two straight lines cross each other is called a Dirac point, where graphene electrons have peculiar electronic physical properties of behaving as fermions having an effective mass of zero. For this reason, graphene exhibits a mobility of $10^7$ cm$^2$ V$^{-1}$s$^{-1}$ or more, which is the highest value among the existing substances, and has a feature of small temperature dependence.

The monolayer graphene is basically a metal or a semimetal having a band gap of zero. However, when a size of the monolayer graphene is of a nanometer order, the band gap becomes wide, and the monolayer graphene becomes a semiconductor having a finite band gap, depending on a width and end structure of graphene. Further, the bilayer graphene has a band gap of zero in the absence of perturbation. However, when such perturbation as to break the minor symmetry between two graphenes, for example, an electric field is applied, the bilayer graphene is to have a finite gap in accordance with a magnitude of the electric field.

For example, the gap is opened by about 0.25 eV at an electric field of 3 Vnm$^{-1}$. The trilayer graphene exhibits a semimetallic electronic physical properties in which a conduction band and a valence band overlap each other with a width of about 30 meV. The property in which the conduction band and the valence band overlap each other is close to that of bulk graphite. Graphenes including four or more layers also exhibit semimetallic physical properties, and as the number of layers increases, the electronic physical properties of the graphenes get closer to those of the bulk graphite gradually.

Further, graphene is also excellent in mechanical characteristics, and a Young's modulus of one layer of the graphene is 2 TPa, which is remarkably large. A tensile strength thereof is at the highest level of the existing substances.

In addition, graphene has unique optical characteristics. For example, in a wide electromagnetic wave region from an ultraviolet light region (wavelength: about 200 nm) to a region in the vicinity of terahertz light (wavelength: about 300 μm), a transmittance of graphene is 1−nα (n: number of layers of graphene, n=about 1 to 10, α: fine structure constant, $\alpha = e^2/2hc\in_0 = 0.0229253012$, e: quantum of electricity, h: Planck's constant, $\in_0$: dielectric constant of vacuum). Thus, the transmittance of graphene is represented only by a basic physical constant instead of a material constant of graphene. This is a unique feature of graphene which cannot be found in the other substance materials.

Further, the transmittance and reflectance of graphene exhibit carrier density dependence in a terahertz light region. This means that the optical characteristics of graphene can be controlled based on an electric field effect. It is also known that the other two-dimensional atomic layer thin films have peculiar physical properties based on the dimensionality.

Graphene has exceptional electronic physical properties and optical characteristics and excellent mechanical characteristics and chemical characteristics as described above. Hence, it is expected that graphene is used in a wide range of industrial fields from chemistry to electronics. In particular, in semiconductor devices and micro mechanical devices in the next-generation electronics, spintronics, optoelectronics, micro- and nanomechanics, and bioelectronics fields, graphene is being deployed throughout the world. Research and development are also being conducted actively with respect to the other two-dimensional atomic layer thin films for the purpose of industrial utilization in the same way as in graphene.

When graphene is used in a semiconductor device such as a channel of a field effect transistor (FET), a substrate for supporting graphene (graphene substrate) is required.

As manufacturing methods for a graphene substrate as conventional technologies, the following four methods have been used.

That is, the four methods are: (1) a manufacturing method using peeling (see Non Patent Literature 2); (2) a manufacturing method using CVD (Chemical Vapor Deposition) (see Non Patent Literature 3); (3) a manufacturing method using pyrolysis of silicon carbide (SiC) (see Non Patent Literature 4); and (4) a manufacturing method using gallium-amorphous carbon interface growth (see Patent Literature 1 and Non Patent Literature 5).

The manufacturing method using peeling according to the above-mentioned item (1) is a method involving peeling graphite-graphene flakes from a graphite crystal such as natural graphite or highly oriented pyrolytic graphite (HOPG) with an adhesive tape, and attaching the flakes to a substrate.

Further, the manufacturing method using CVD according to the above-mentioned item (2) is a method involving subjecting a hydrocarbon such as methane to thermal or plasma decomposition on a substrate on which a metallic catalyst has been deposited from the vapor or a foil serving as a metallic catalyst to grow graphene, removing the unnecessary metallic catalyst with an acid or the like, and transferring the graphene onto another substrate.

Further, the manufacturing method using pyrolysis of silicon carbide (SiC) according to the above-mentioned item (3) is a method involving subjecting a SiC substrate to heat treatment at high temperature (about 1,600° C.), and allowing carbon atoms to aggregate on the substrate while evaporating silicon atoms from the surface of the substrate to grow graphene on the substrate.

Further, the manufacturing method using gallium-amorphous carbon interface growth according to the above-mentioned item (4) is a method involving bringing a liquid gallium layer into contact with an amorphous carbon layer deposited from the vapor on a substrate from above at high temperature (about 1,000° C.) to grow graphene on the amorphous carbon by an interface reaction, transferring the composite layer of gallium layer/graphene layer/amorphous carbon layer to another substrate, and dissolving the gallium with an acid to obtain a composite layer of graphene layer/amorphous carbon layer. According to the method according to the above-mentioned item (4), the amorphous carbon layer/graphene layer/substrate is formed in the stated order with one transfer, and hence graphene is set to be an uppermost layer in response to the demand in terms of manufacturing of a device. That is, in order to obtain the graphene layer/amorphous layer/substrate formed in the stated order, still another transfer (total two transfers) is required.

CITATION LIST

Patent Literature

Patent Literature 1: Japanese Unexamined Patent Application Publication (JP-A) No. 2010-037128

Non Patent Literature

Non Patent Literature 1: Ando, "The electronic properties of graphene and carbon nanotubus," NPG Asia Materials 1(1), 2009, p 17-21.

Non Patent Literature 2: K. S. Novoselov, D. Jiang, F. Schedin, T. J. Booth, V. V. Khotkevich, S. V. Morozov, and A. K. Geim, "Two-dimensional atomic crystals," PNA S, 102 (30), 2005, p 10451-10453.

Non Patent Literature 3: Xuesong Li, Weiwei Cai, Jinho An, Seyoung Kim, Junghyo Nah, Dongxing Yang, Richard Piner, Aruna Velamakanni, Inhwa Jung, Emanuel Tutuc, Sanjay K. Banerjee, Luigi Colombo, and Rodney S. Ruoff, "Large-Area Synthesis of High-Quality and Uniform Graphene Films on Copper Foils," Science, Vol. 324, 2009, p 1312-1314.

Non Patent Literature 4: M. Kusunoki, T. Suzuki, T. Hirayama, N. Shibata, and K. Kaneko, "A formation mechanism of carbon nanotube films on SiC(0001)," Applied Physics Letters, Vol. 77(4), 2000, p 531-533.

Non Patent Literature 5: Fujita, Ueki, Miyazawa, and Ichihashi, "Graphitization at interface between amorphous carbon and liquid gallium for fabricating large area graphene sheets," Journal of Vacuum Science & Technology. Second Series. B, Vol. 77(4), 2006, p 3063-3066.

DISCLOSURE OF THE INVENTION

Problems to be Solved by the Invention

However, the methods of manufacturing a graphene substrate as the conventional technologies have the following problems.

First, the methods using peeling according to the above-mentioned item (1) have a problem in that it is difficult to mass-produce substrates.

Second, the methods using CVD according to the above-mentioned item (2) have a problem in that quality is degraded due to the introduction of defects and impurities during the graphene transfer step. Further, explosive hydrogen gas is used for reducing a metal surface, and hence there is also a problem in that cost for a safety measure such as explosion protection is required.

Third, according to the methods using pyrolysis of silicon carbide (SiC) according to the above-mentioned item (3), in the case of SiC pyrolysis graphene, an intermediate layer which degrades the characteristics of graphene is inserted between the graphene and the SiC substrate upper layer. The intermediate layer generally causes a reduction in quality, and further, in the case where an off-angle of a SiC substrate is zero, the quality of graphene is degraded due to roughening (roughened surface). Thus, there is a constraint in terms of selection of a substrate that an inclined substrate (off-angle: 3.5° to 8°) should be used so as to prevent the roughening. Further, it is necessary that a SiC substrate to be used be subjected to pretreatment with hydrogen plasma. Further, in order to promote desorption of silicon, silane gas treatment is also required and high temperature of 1,400 to 1,600° C. is used for SiC pyrolysis, which necessitates a special device in accordance with the conditions. Therefore, there is also a problem in that facility cost is required for a special gas device and a high-temperature device.

Fourth, according to the methods using gallium-amorphous carbon interface growth according to the above-mentioned item (4), in the case of gallium-amorphous carbon interface growth graphene, graphene to be obtained finally has a layer structure of graphene layer/amorphous carbon layer/support substrate. The layer structure causes a problem in that an extra amorphous carbon layer serves as a main path for electric conduction, thereby being difficult to form a device.

This invention has been made in view of the above-mentioned problems, and it is an object of this invention to provide a method of manufacturing a graphene substrate as graphene on insulator which can be mass-produced, has high quality, and can be used directly for producing a semiconductor device at low production cost.

Means to Solve the Problem

In order to achieve the object, according to a first aspect of this invention, there is provided a method of manufacturing a graphene substrate, including the steps of: (a) bringing a metal layer into contact with a carbon-containing layer and heating the metal layer to dissolve carbon in the carbon-containing layer into the metal layer; and (b) cooling the metal layer to precipitate the carbon in the metal layer as graphene on a surface of any layer brought into contact with the metal layer.

According to a second aspect of this invention, there is provided a graphene substrate, which is manufactured by the method of manufacturing a graphene substrate according to the first aspect of this invention.

According to a third aspect of this invention, there is provided a semiconductor element, which is manufactured through use of the graphene substrate according to the second aspect.

Effect of the Invention

According to this invention, the method of manufacturing a graphene substrate as graphene on insulator which can be mass-produced, has high quality, and can be used directly for producing a semiconductor device at low production cost can be provided.

MODE FOR EMBODYING THE INVENTION

Embodiments of this invention are hereinafter described in detail with reference to the drawings.

First, an overview of a method of manufacturing a graphene substrate according to a first embodiment is described with reference to FIGS. 1(a) to 1(e).

Figure 1:
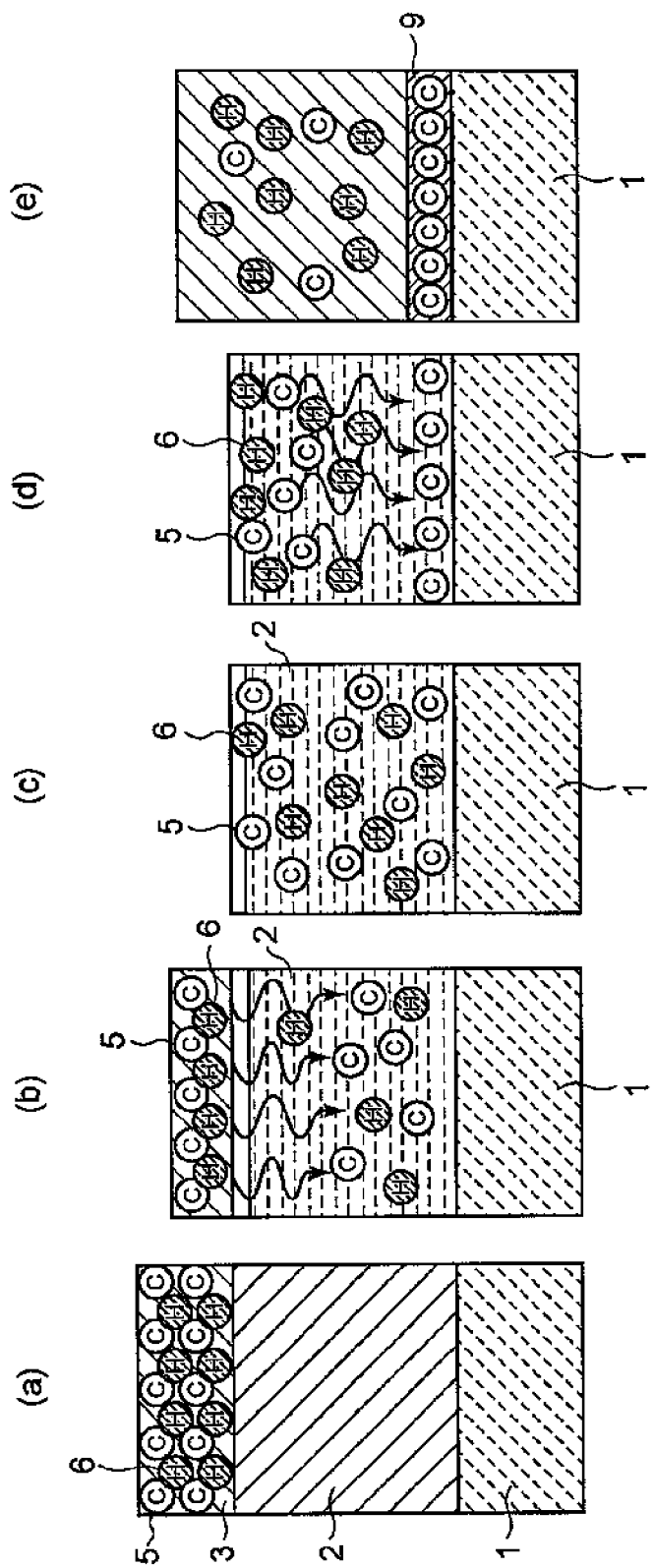
FIG. 1 is sectional views each illustrating an overview of a method of manufacturing a graphene substrate according to a first embodiment.

First, as illustrated in FIG. 1(a), a metal layer 2 is arranged between a growth substrate 1 and a carbon-containing layer 3 to form a three-layer structure of growth substrate 1/metal layer 2/carbon-containing layer 3. It should be noted that, even when the order of the three-layer structure is opposite, that is, even in the case of a three-layer structure of carbon-containing layer 3/metal layer 2/growth substrate 1, the effects described later are the same.

In this case, the carbon-containing layer 3 may contain elements 6 other than carbon 5 or may be formed of only the carbon 5.

Second, the three-layer structure is heated at appropriate temperature. Then, as illustrated in FIG. 1(b), the metal layer 2 becomes liquid, and the carbon 5 and the other elements 6 start being dissolved into the metal layer 2 from the surface layer of the carbon-containing layer 3. When appropriate time elapses, the entire carbon-containing layer 3 is finally dissolved into the metal layer 2 as illustrated in FIG. 1(c).

That is, the metal layer 2 serves as a flux for dissolving the carbon 5 in a liquid state.

In this case, as the metal layer 2, a layer having a remarkably low carbon solubility even at high temperature, specifically, a layer having a carbon solubility at a ppm level is used. In general, the carbon solubility of a metal that hardly dissolves carbon is not known, but is empirically presumed to fall within a range of 0.1 ppm to 10 ppm at a temperature of 800° C.

Thus, even when the carbon-containing layer 3 contains the elements 6 other than the carbon 5, the remarkably low carbon solubility controls a rate, and the other elements 6 are dissolved into the metal layer 2 only in a trace amount.

Third, the metal layer 2 into which the carbon 5 has been dissolved in a trace amount is cooled. Then, as illustrated in FIG. 1(d), the carbon solubility of the metal layer 2 decreases, resulting in an oversaturated state. Therefore, the carbon 5 starts being precipitated or deposited on any surface brought into contact with the metal layer 2. When appropriate time elapses, the carbon 5 is finally crystallized on the surface of the growth substrate 1 as graphene 9 as illustrated in FIG. 1(e). That is, the carbon 5 in the carbon-containing layer 3 is a source for the graphene 9.

Regarding the graphene growth, during cooling, the carbon 5 in the metal layer 2 is precipitated as the graphene 9 having a two-dimensional structure but is not precipitated as amorphous carbon. The reason for this is considered to be the effect that the metal layer 1 as a flux serves as a catalyst for forming graphene.

Further, it is also considered that the smoothness of the surface of the growth substrate 1 and the lattice matching between the growth substrate 1 and the surface structure of the graphene structure have a function of accelerating the growth of the layer of the graphene 9.

It should be noted that the other elements 6 are not generally precipitated during cooling illustrated in FIG. 1(d). This is because, in the case where the other elements are those other than carbon, for example, the other elements are metal elements, the solubility of the metal elements with respect to the metal layer 2 is at a % level even at room temperature, and hence oversaturation does not occur. Further, it is considered that, in the case where the other elements 6 are light elements such as hydrogen, oxygen, and nitrogen, the solubility of the light elements with respect to the metal layer 2 is high, and the light elements partly become gas after dissolution by heating to be released from the metal layer 2.

Therefore, only the graphene 9 can be selectively formed directly on the surface of the growth substrate 1 without anything interposed.

The foregoing is the overview of the method of manufacturing a graphene substrate by a flux method shown in this invention.

Figure 2:
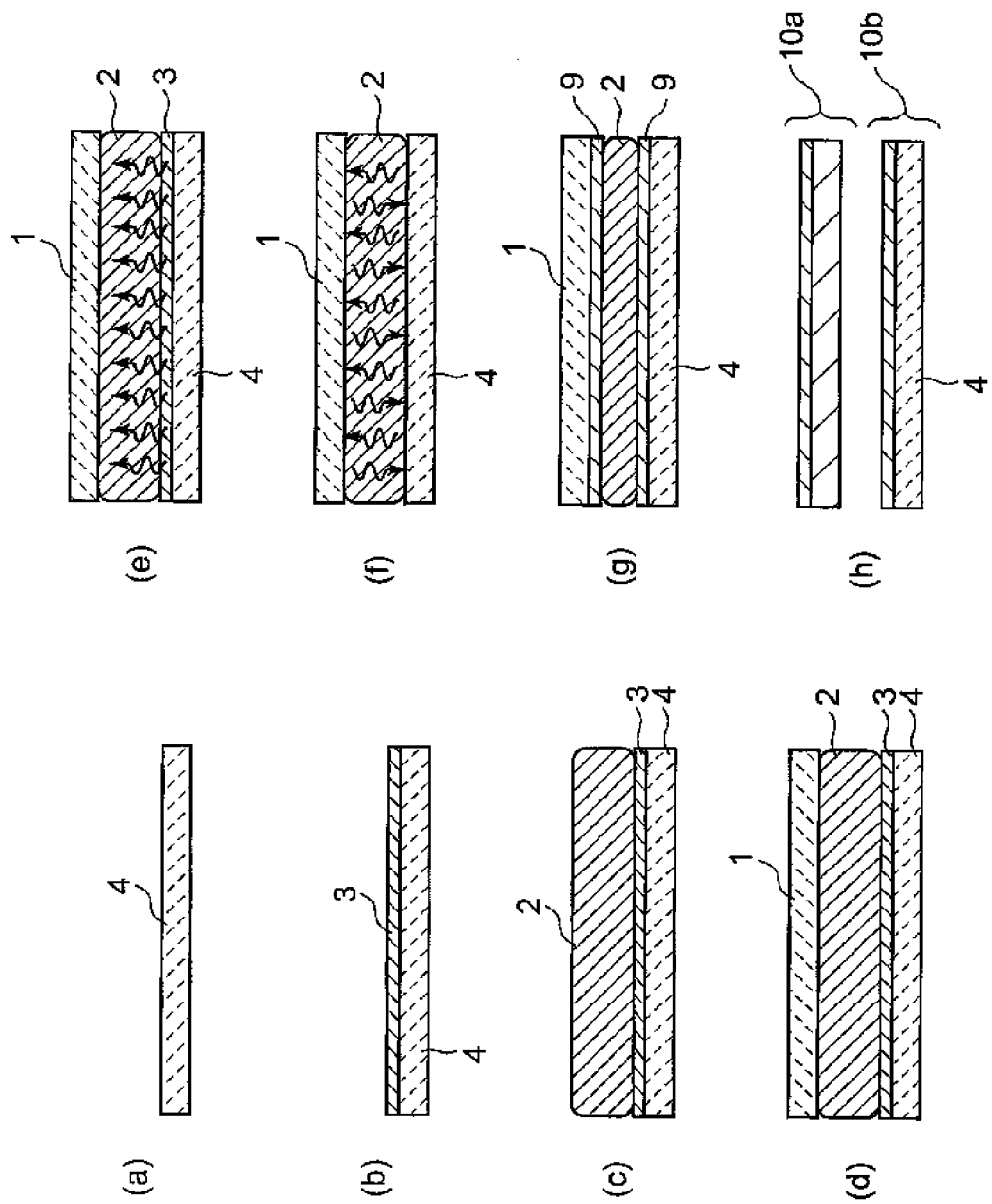
FIG. 2 is sectional views each illustrating a detail of the method of manufacturing a graphene substrate according to the first embodiment.

Next, a method of manufacturing a graphene substrate 10 (collective term for 10a, 10b, 10c, . . . ) is described more specifically with reference to FIG. 2. Different alphabet symbols attached to the reference number of 10 represent that graphene substrates are different from each other in bodies or materials.

First, as illustrated in FIG. 2(a), a source-supporting substrate 4 is prepared. The source-supporting substrate 4 has a function of holding the carbon-containing layer 3 for producing graphene. It should be noted that, as described later, the source-supporting substrate 4 also serves as a substrate for growing the graphene 9 in some cases, and forms the graphene substrate 10b by involving the graphene 9.

A material for the source-supporting substrate 4 can be selected from those having heat resistance, and at least one is selected mainly from the following five groups.

The first group includes oxides, such as quartz ($SiO_2$), alumina or sapphire ($Al_2O_3$), titanium oxide ($TiO_2$), zinc oxide (ZnO), magnesium oxide (MgO), nickel oxide (NiO), zirconia ($ZrO_2$), lithium niobate ($LiNbO_3$), and lithium tantalate ($LiTaO_3$).

The second group includes nitrides, such as boron nitride (BN), aluminum nitride (AlN), gallium nitride (GaN), carbon nitride ($C_3N_4$), and boron carbon nitride (BCN).

The third group includes carbides, such as silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), and tungsten carbide (WC).

The fourth group includes fluorides, such as barium fluoride ($BaF_2$), calcium fluoride ($CaF_2$), and magnesium fluoride ($MgF_2$).

The fifth group includes other heat-resistant materials, such as mica and diamond.

It should be noted that, as described later, all the materials in the third group and diamond in the fifth group can be used as a source for the carbon-containing layer 3.

It should be noted that, in the case where the carbon-containing layer 3 serves as a substrate for holding itself, the source-supporting substrate 4 is not necessarily required. It should be noted that the surface of the source-supporting substrate 4 is cleaned in advance by an appropriate method.

Second, as illustrated in FIG. 2(b), the carbon-containing layer 3 is arranged on the surface of the source-supporting substrate 4. The carbon-containing layer 3 serves as a source for supplying carbon in the production of graphene.

As a material for the carbon-containing layer 3, any substance can be basically used as long as the substance contains carbon, and at least one is selected mainly from the following five groups.

The first group includes carbon allotropes, such as amorphous carbon, glassy carbon, crystalline graphite, single-walled and multi-walled carbon nanotubes, fullerene typified by $C_{60}$ and $C_{70}$, diamond, and nanodiamond.

The second group includes low-molecular organic compounds, such as a metallocene, naphthalene, anthracene, and pentacene.

The third group includes artificial high-molecular organic compounds, such as Teflon (registered trademark), polymethyl methacrylate (PMMA), and polyethylene.

The fourth group includes natural high-molecular organic compounds, such as a protein, a nucleic acid, a lipid, and a polysaccharide.

The fifth group includes inorganic compounds containing carbon, such as silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), tungsten carbide (WC), carbon nitride ($C_3N_4$), and boron carbon nitride (BCN). It should be noted that in the choice of the material for the carbon-containing layer 3, the following is known empirically.

As the content of carbon in a material to be used as the source for the carbon-containing layer 3 is higher, graphene of good quality tends to be obtained. When the atomic ratio of carbon is less than 20%, the elements other than carbon tend to have an adverse effect on the quality of graphene. Thus, it is desired that the material for the carbon-containing layer 3 is a substance containing carbon at an atomic ratio of 20% or more. In particular, the carbon allotrope materials of the first group are formed of only substantially pure carbon, and hence are excellent as the source for the carbon-containing layer 3.

A formation method for the carbon-containing layer 3 is as follows.

The carbon-containing layer 3 is not necessarily required to be a uniform film. That is, it suffices that the carbon-containing layer 3 is arranged locally on the surface of the source-supporting substrate 4. This is because, as described above, the carbon-containing layer 3 merely supplies the carbon 5 to be dissolved into the metal layer 2 and does not directly relate to the growth of the graphene 9.

It should be noted that, when the ease of dissolution of the carbon 5 into the metal layer 2 and the uniformity of the concentration of carbon after dissolution are taken into consideration, it is desired that the carbon-containing layer 3 be a uniform film to some degree.

As a manufacturing method for a uniform film, there are mainly given the following three methods, depending on the properties and shapes of a carbon-containing material.

The first method is a dry film formation method, such as a vacuum deposition method, a molecular beam deposition method, an ion plating method, an ion beam deposition method, a chemical deposition method, or a sputtering method. Such methods can be used for a wide range of carbon-containing materials belonging to the first group to the fifth group. Although the first method has a disadvantage of high device cost, the first method has an advantage of being able to produce a very thin uniform film.

The second method is a wet film formation method, such as a dropping method, a spin coating method, or a dip coating method. Most of the carbon-containing compounds belonging to the second group to the fourth group are soluble in a solvent, and hence the second method can be applied to the compounds belonging to the second group to the fourth group by preparing the solutions thereof. Further, the second method can be applied to the solid-based carbon-containing materials belonging to the first group and the fifth group by suspending fine particles and powder thereof in a solvent. The second method has advantages of low cost and of being applied to a wide range of carbon-containing materials.

The third method includes a spray coating method, an air spray coating method, an electrodeposition coating method, an electrostatic coating method, and the like. Those methods depend on the adhesion ability and surface potential of a carbon-containing material, and hence have a disadvantage of being applicable only to a limited range of carbon-containing materials. However, the third method is particularly suitable for producing a uniform film with a large area.

Third, as illustrated in FIG. 2(c), the metal layer 2 is arranged on the carbon-containing layer 3 so as to be in close contact therewith. As described above, the metal layer 2 serves as a flux for dissolving the carbon 5. Further, as described above, as the metal layer 2, a layer having a carbon solubility at a ppm level is used.

The use of a metal having a very low carbon solubility is a prerequisite condition for forming graphene as an atomic layer thin film having an extremely small thickness, instead of graphite.

As such metal, there can be used, for example, at least one metal element selected from the group consisting of gallium (Ga), indium (In), tin (Sn), aluminum (Al), zinc (Zn), cadmium (Cd), mercury (Hg), thallium (Tl), lead (Pb), and bismuth (Bi).

It should be noted that, when effects on an environment and a human body are taken into consideration, it is preferred to use gallium (Ga), indium (In), tin (Sn), aluminum (Al), zinc (Zn), or bismuth (Bi) alone, or an alloy thereof. Of those, gallium has features of having a temperature range of 29.8 to 2,403° C. in a liquid state, which is the widest among simple elements, and having a very low vapor pressure even at high temperature (for example, $10^{-3}$ Pa at 800° C.). The features mean that gallium serves as a flux in a very wide temperature range, and is much less eliminated by evaporation during heating. Thus, gallium and an alloy thereof are particularly excellent as a material for the metal layer 2.

It should be noted that, in the case of performing the step of bringing the metal layer 2 and the carbon-containing layer 3 into close contact with each other at room temperature, a material metal for the metal layer 2 which is liquid at around room temperature is easy to handle.

For example, examples of the metal which is liquid at around room temperature include a gallium-indium alloy (melting point: about 15.7° C.), a gallium-indium-tin alloy (melting point: 19° C.), a gallium-aluminum alloy (melting point: 26.5° C.), gallium (melting point: 29.8° C.), and a bismuth-lead-tin-cadmium-indium alloy (melting point: about 46.7° C.).

It should be noted that, in the case of performing the step of bringing the layers into close contact with each other under appropriate heating, it is not necessarily required to use a metal having a melting point at around room temperature.

Fourth, as illustrated in FIG. 2(d), the growth substrate 1 is arranged on the metal layer 2 so as to be in close contact therewith. Accordingly, a four-layer structure of source-supporting substrate 4/carbon-containing layer 3/metal layer 2/growth substrate 1 is formed. It should be noted that, even in the case where the order of the four-layer structure is opposite, that is, in the case of a four-layer structure of growth substrate 1/metal layer 2/carbon-containing layer 3/source-supporting substrate 4, the same effects are obtained. It should be noted that, as described above, in the case where the carbon-containing layer 3 serves as a substrate for holding itself, the source-supporting substrate 4 is not necessarily required.

Thus, a three-layer structure is provided if the source-supporting substrate 4 is not used. The growth substrate 1 serves as a substrate for growing the graphene 9 on the surface thereof and forms the graphene substrate 10a by involving the graphene 9.

In this case, a material for the growth substrate 1 can be selected from those having heat resistance in the same way as in the material for the source-supporting substrate 4, and at least one is selected mainly from the following five groups.

The first group includes oxides, such as quartz ($SiO_2$), alumina or sapphire ($Al_2O_3$), titanium oxide ($TiO_2$), zinc oxide (ZnO), magnesium oxide (MgO), nickel oxide (NiO), zirconia ($ZrO_2$), lithium niobate ($LiNbO_3$), and lithium tantalate ($LiTaO_3$).

The second group includes nitrides, such as boron nitride (BN), aluminum nitride (AlN), gallium nitride (GaN), carbon nitride ($C_3N_4$), and boron carbon nitride (BCN).

The third group includes carbides, such as silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), and tungsten carbide (WC).

The fourth group includes fluorides, such as barium fluoride ($BaF_2$), calcium fluoride ($CaF_2$), and magnesium fluoride ($MgF_2$).

The fifth group includes other heat-resistant materials, such as mica and diamond.

It should be noted that, from the viewpoint of using the graphene substrate 10 as a substrate for producing an electronic device, it is a prerequisite that the growth substrate 1 be an insulator. Of the five groups, part of the carbides belonging to the third group has metallic properties, but the other carbides are basically insulators. Therefore, the carbides belonging to the third group can be used for producing an electronic device in most cases.

Next, the flatness of the growth substrate 1 is described.

Further, in order to obtain graphene of high quality, it is desired that the growth substrate 1 be flat in a desired plane on which graphene is intended to be grown. From the viewpoint of flatness, a single crystal substrate or a substrate having a single crystal film formed on the surface thereof is particularly suitable as the growth substrate 1.

In this case, the "graphene of high quality" means graphene having high crystallinity.

Specifically, graphene having a small D/G ratio, which is a ratio between an intensity of a D-band and that of a G-band obtained by Raman spectroscopy, has high quality. It is preferred that the D/G ratio be as small as possible, and a D/G ratio of ≤0.2 is desired.

It should be noted that the D-band is a disorder band which is a Raman band derived from a defective structure appearing in the vicinity of 1,350 cm$^{-1}$, and the G-band is a graphite band which is a Raman band derived from a totally symmetric stretching vibration of a C—C bond in an ideal crystal appearing in the vicinity of about 1,580 cm$^{-1}$.

Further, considering the limitation of graphene quality, the highest quality is a non-defective perfect crystal having a D/G ratio of 0, and the lowest quality is an amorphous crystal having a D/G ratio of ≥1.

As an enhancement method for the flatness of the growth substrate 1, there are given the following four methods depending on the properties and shapes of a substrate.

The first method is a dry etching method such as vacuum heating treatment or hydrogen plasma treatment. Although the first method has a disadvantage of high device cost, the first method is capable of ensuring clean and high-precision flatness.

The second method is a wet etching method such as hydrofluoric acid (HF) treatment or phosphoric acid ($H_3PO_4$) treatment. The second method has advantages of simpleness and low cost.

The two methods can be used for the purpose of enhancing local flatness with respect to a substrate having a three-dimensional structure on the surface, as well as for the purpose of obtaining flatness of the entire substrate.

The third method includes lap polishing, optical polishing, chemical mechanical polishing (CMP), and the like. The third method is suitable for ensuring the flatness of the entire substrate. In particular, by using the CMP, the flatness at an atomic level is obtained.

The fourth method is a method using a substrate surface which is highly lattice-matched with a graphene structure. In this case, graphene of particularly high quality is obtained. As a substrate satisfying the condition, there is given a single crystal of hexagonal boron nitride (h-BN).

It should be noted that the surface of the growth substrate 1 is cleaned in advance by an appropriate method.

Fifth, when heating is performed, the carbon 5 and the other elements 6 are dissolved into the metal layer 2 from the surface of the carbon-containing layer 3, as illustrated in FIG. 2(e).

It is preferred that heating be performed under vacuum or an inert gas flow so as to prevent an undesired chemical reaction such as oxidation of the metal layer 2 and the carbon-containing layer 3.

As means for heating, there are given the following three methods.

The first method is a heating method using an electric furnace or an infrared lamp. In this case, the entire four-layer structure of source-supporting substrate 4/carbon-containing layer 3/metal layer 2/growth substrate 1 described above is heated. This method has advantages of simpleness and low cost.

The second method is a heating method using a high-frequency induction heating device. In this case, when the carbon-containing layer 3 is not a conductor, only the metal layer 2 is selectively heated, and when the carbon-containing layer 3 is graphite-based carbon, only the metal layer 2 and the carbon-containing layer 3 are selectively heated. However, the members of the four-layer structure of source-supporting substrate 4/carbon-containing layer 3/metal layer 2/growth substrate 1 are in close contact with each other, and hence the source-supporting substrate 4, the carbon-containing layer 3, and the growth substrate 1 are also heated indirectly by heat conduction from the metal layer 2. Although the second method has a disadvantage of high device cost, the second method has advantages of being able to perform quickly heating and cooling and to reduce energy cost owing to local heating.

The third method is a heating method using a microwave dielectric heating device. In this case, dielectric portions other than the metal layer 2 or the metal layer 2 and the carbon-containing layer 3, that is, the source-supporting substrate 4, the growth substrate 1, and a container for accommodating the four-layer structure, such as a holder 11, a spacer 12, and a lid 13 of FIG. 4 described later are selectively heated. However, for the same reason as that for the case of induction heating, the metal layer 2 or the metal layer 2 and the carbon-containing layer 3 are also heated indirectly. In the same way as in the second method, the third method also has a disadvantage of high device cost. However, the third method has advantages of being able to perform quick heating and cooling and to reduce energy cost owing to local heating.

The condition of the heating temperature is as follows.

The heating temperature is required to be 600° C. or more, desirably 800° C. or more, more preferably 1,000° C. or more. It should be noted that the lower limit of the temperature range, i.e., 600° C. corresponds to the temperature which is at least required for forming graphene. Further, when the heating temperature is set to 800° C. or more, graphene of high quality having a D/G ratio of ≤0.2 can be formed. Further, when the heating temperature is set to 1,000° C. or more, the graphene 9 of particularly high quality having a D/G ratio of ≤0.1 can be obtained.

Sixth, when cooling is performed, as illustrated in FIG. 2(f), the carbon 5 dissolved into the metal layer 2 starts being precipitated on both the surfaces of the growth substrate 1 and the source-supporting substrate 4 brought into contact with the metal layer 2, and finally, the graphene 9 is formed directly on both the substrates as illustrated in FIG. 2(g).

In this case, as described above, the other elements 6 dissolved into the metal layer 2 are not oversaturated, and hence are generally not precipitated. Only the graphene 9 is formed directly on the surfaces of the growth substrate 1 and the source-supporting substrate 4 without anything interposed.

It should be noted that FIG. 2(f) illustrates the case where the concentration of the carbon 5 in the metal layer 2 is smaller than the carbon solubility of the metal layer 2 during heating, that is, the case where the entire amount of the carbon 5 is dissolved into the metal layer 2. Thus, the graphene 9 is formed on both the surfaces of the growth substrate 1 and the source-supporting substrate 4. In this case, both the growth substrate 1 and the source-supporting substrate 4 on which the graphene 9 has been grown can be used as the graphene substrates 10a, 10b.

On the other hand, in the case where the carbon-containing layer 3 is arranged in an amount equal to or more than the carbon solubility of the metal layer 2 during heating, part of the carbon-containing layer 3 remains on the source-supporting substrate 4. Thus, during cooling, the graphene 9 is grown on the surface of the growth substrate 1 with which the metal layer 2 is in contact and the surface of the residue of the carbon-containing layer 3. In this case, the growth substrate 1 on which the graphene 9 has been grown is used as the graphene substrate 10a. It should be noted that, in the case of substrates in which the material for the carbon-containing layer 3 is made of diamond belonging to the first group or a carbide belonging to the third group, as long as those substrates are insulating substrates, they can be used as the graphene substrate 10b.

The cooling condition is as follows.

It is desired that the temperature drop per unit time, that is, the cooling rate fall within a range of 0 to 100° C./min in a range of the heating temperature to 400° C. Herein, the cooling rate of 0° C./min means maintaining a certain temperature. It should be noted that natural cooling may be performed at 400° C. or less. Further, by performing slow cooling (for example, cooling rate: 2° C./min) after rapid cooling (for example, cooling rate: 50° C./min), the driving force for crystallization of the carbon 5, that is, the growth of the graphene 9 can be enhanced. This can enhance the quality of graphene.

Seventh, when the metal layer 2 is removed, the graphene substrates 10a, 10b are obtained as illustrated in FIG. 2(h).

The metal layer 2 is removed in the following two stages.

In the first stage, the metal layer 2 is physically removed by an appropriate method such as suction while being kept in a liquid state. In this stage, most part of the metal layer 2 is removed from the graphene substrates 10a, 10b. It should be noted that a material for the metal layer 2 removed in the first stage can be used again as a flux. In particular, in the case of using gallium (Ga) which is a rare metal, the regeneration of a flux is effective for remarkably lowering production cost.

In the second stage, a residue of the metal layer 2 which has not been removed in the first stage is removed by chemical treatment. Specifically, the graphene substrates 10a, 10b are washed in an acid/alkali solution to dissolve the residue therein. When the acid/alkali solution is heated to an appropriate temperature (about 80° C.), the dissolution of the metal layer 2 can be accelerated. As an acid for dissolving the residue of the metal layer 2, hydrochloric acid (HCl), sulfuric acid ($H_2SO_4$), nitric acid ($HNO_3$), or the like can be used. In the case of an amphoteric metal such as gallium or aluminum, the residue of the metal layer 2 can also be dissolved through use of an aqueous solution of sodium hydroxide (NaOH), potassium hydroxide (KOH), or tetramethylammonium hydroxide.

Next, a method of manufacturing p-type graphene or n-type graphene is described.

When adding a dopant introducing step to dope an acceptor element or a donor element to the above-mentioned graphene manufacturing step, p-type graphene or n-type graphene can be manufactured.

In general, carriers of graphene exhibit ambipolar conduction in which holes and electrons flow in accordance with the direction of an external electric field. However, when only small numbers of other elements are substituted for carbon forming graphene, p-type or n-type carrier conduction becomes dominant depending on the kind of the elements to be substituted for. For example, when group 13 (group number according to Nomenclature of Inorganic IUPAC revised version (1989), the same applies hereinafter) elements, the number of valence electrons of which is smaller by one, or group 2 elements, the number of valence electrons of which is smaller by two, as compared to carbon belonging to group 16 elements, that is, acceptor elements are lattice-substituted for carbon atoms, p-type conduction becomes dominant. On the other hand, when group 15 elements, the number of valence electrons of which is larger by one, or group 16 elements, the number of valence electrons of which is larger by two, as compared to carbon, that is, donor elements are lattice-substituted for carbon atoms, n-type conduction becomes dominant. Thus, when the step of introducing a dopant element is added, the dopant element is dissolved into the metal layer 2 together with carbon during heating, and the dopant element is precipitated together with carbon during cooling. As a result, graphene in which the dopant element is lattice-substituted for part of carbon is obtained.

In the production of the p-type graphene, there may be added a material containing an acceptor element such as: a group 2 element, e.g., beryllium (Be) or magnesium (Mg); or a group 13 element, e.g., boron (B) or aluminum (Al).

In the production of the n-type graphene, there may be added a material containing a donor element, such as: a group 15 element, e.g., nitrogen (N), phosphorus (P), arsenic (As), or antimony (Sb); or a group 16 element, e.g., sulfur (S), selenium (Se), or tellurium (Te).

As an introduction method for a dopant, there are given the following two methods.

The first method is a method involving adding a dopant element to the carbon-containing layer 3 in advance when arranging the carbon-containing layer 3 illustrated in FIG. 2(b). A dopant element alone may be added as it is, or a material containing a dopant element may be added. Alternatively, a material originally containing a dopant element may be selected as a source for the carbon-containing layer.

The second method is a method involving introducing gas containing a dopant element into an atmosphere during heating illustrated in FIG. 2(e). For producing the p-type graphene, diborane gas ($B_2H_6$) is introduced, and for producing the n-type graphene, ammonia ($NH_3$), phosphine gas ($PH_3$), or arsine gas ($AsH_3$) is introduced.

Finally, a control method for the number of layers of the graphene 9 is described. As the method, there are given the following two methods.

The first method is a layer number control method involving adjusting the amount of carbon in a source.

When the carbon concentration of the carbon-containing layer 3 is lower than the carbon solubility of the metal layer 2 at a heating temperature, the entire amount of the carbon-containing layer 3 is dissolved into the metal layer 2. Thus, the number of layers of the graphene 9 can be controlled by adjusting the carbon concentration of the carbon-containing layer 3 in a range lower than the carbon solubility of the metal layer 2.

For example, the surface density of carbon atoms in monolayer graphene is 38.0 pieces/nm$^2$, and hence an n-layer of graphene 9 can be formed on the growth substrate 1 by adjusting the carbon concentration of the carbon-containing layer 3 to 75.7 ng/cm$^2$ (nanograms/square centimeter)×n (n represents a natural number) in terms of surface density.

Figure 3:
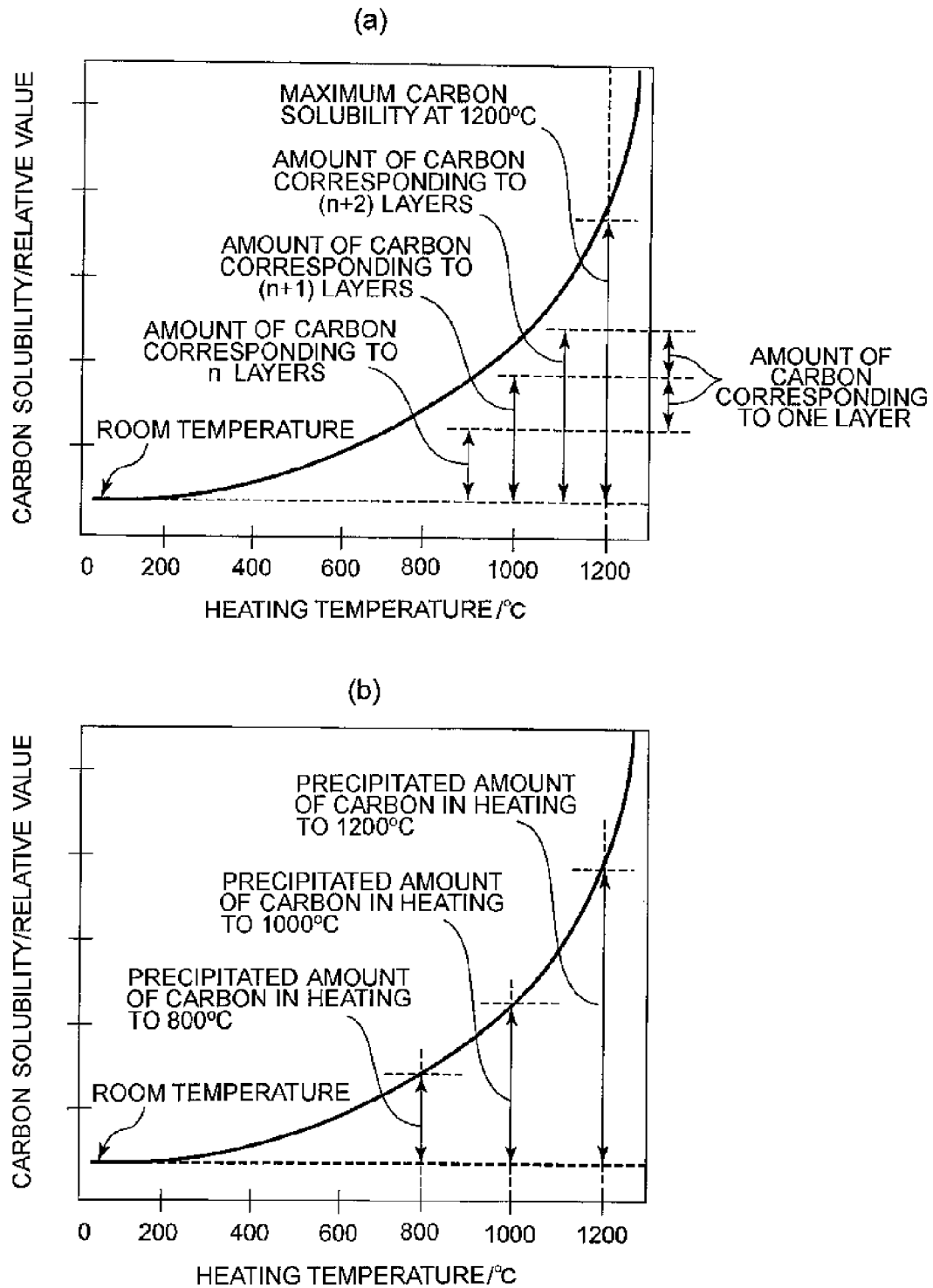
FIG. 3 is graphs each showing a relationship between a carbon solubility and a heating temperature according to the first embodiment.

Referring to FIG. 3(a), a layer number control method involving adjusting the amount of carbon through use of a carbon solubility curve is described. Herein, the case of heating to 1,200° C. is considered. The maximum solubility at 1,200° C. is as shown in FIG. 3(a). When the carbon-containing layer 3 is prepared, the amount of carbon is adjusted in advance to those corresponding to n layers, (n+1) layers, and (n+2) layers with the amount of carbon for one layer shown in the figure being a unit, in a range smaller than the maximum solubility. It should be noted that, although it is necessary to consider the amount of carbon corresponding to the carbon solubility at room temperature, the carbon solubility at room temperature is generally negligibly small. The carbon 5 is temporarily dissolved into the metal layer 2 during heating and precipitated as the graphene 9 during cooling. The amount of carbon is adjusted, and hence the number of layers of the graphene 9 to be obtained ends up n layers, (n+1) layers, and (n+2) layers. Thus, the number of layers of graphene can be controlled by adjusting the amount of carbon in a source. According to the method, a high heating temperature can be selected, and hence the graphene 9 of particularly high quality can be obtained while the number of layers is controlled.

The second method is a layer number control method involving adjusting a heating temperature.

The carbon solubility of the metal layer 2 depends on the temperature, and hence the number of layers of the graphene 9 can also be controlled by adjusting the heating temperature. In general, the carbon solubility of a metal increases along with an increase in temperature. Therefore, when it is assumed that the amount of carbon in the carbon-containing layer 3 is sufficient, the graphene 9 having a larger number of layers can be formed as the heating temperature rises.

Referring to FIG. 3(b), a layer number control method involving adjusting a heating temperature through use of a carbon solubility curve is described. The maximum carbon solubility at each heating temperature of 800° C., 1,000° C., and 1,200° C. is as shown in the figure. When the carbon-containing layer 3 is prepared, the amount of carbon in the carbon-containing layer 3 is adjusted in advance so as to obtain the maximum solubility or more. Then, after heating and cooling, the carbon 5 in an amount corresponding to the difference in maximum carbon solubility between room temperature and each heating temperature is converted into the graphene 9. This method is useful as a layer number control method in the case where the first method cannot be used, for example, in the case where the amount of carbon cannot be adjusted freely because a bulk substrate made of glassy carbon, diamond, or silicon carbide is used as the carbon-containing layer 3.

As described above, according to the first embodiment, the metal layer 2 is brought into contact with the carbon-containing layer 3 and the growth substrate 1 simultaneously, and the resultant is heated to dissolve the carbon 5 in the carbon-containing layer 3 into the metal layer 2. Then, the resultant is cooled to precipitate the carbon 5 in the metal layer 2 as the graphene 9 on the surfaces of the growth substrate 1 and the source-supporting substrate 4. Thus, the graphene substrates 10a, 10b are manufactured.

Therefore, there is an advantage in that the graphene substrates 10a, 10b can be increased in scale, and a graphene substrate with a large area can be manufactured.

Further, in the first embodiment, high-temperature (about 1,600° C.) treatment, and hydrogen plasma treatment/silane treatment of a substrate as in the case of the SiC pyrolysis graphene are not required, resulting in a reduction in cost.

Further, according to the first embodiment, insulators are used as the growth substrate 1 and the source-supporting substrate 4. That is, the graphene substrates 10a, 10b are graphene on insulator substrates. Therefore, completely unlike the case of gallium-amorphous carbon interface growth graphene, the graphene substrates 10a, 10b according to the first embodiment can be used directly for the production of graphene devices. Further, in the first embodiment, the transfer step which degrades the quality of the graphenes 10a, 10b as in the case of the CVD graphene is not required, and hence there is an advantage in that a graphene device can be produced while high quality thereof is maintained.

That is, the manufacturing method for graphene according to the first embodiment has mass-productivity and enables graphene of high quality to be obtained. In addition, the method realizes low manufacturing cost, and can be directly used for manufacturing a semiconductor device.

Next, a second embodiment is described.

The basic manufacturing procedure according to the second embodiment of this invention is similar to that of the first embodiment except for three differences.

The first difference lies in that an attempt is made to prevent the metal layer 2 from outflowing or flowing, specifically, the metal layer 2 is surrounded by the spacer 12, and the lid 13 serves as a weight.

The second difference lies in that an attempt is made to prevent elimination of the metal layer 2 by evaporation, specifically, the entire four-layer structure (including the spacer 12) of source-supporting substrate 4/carbon-containing layer 3/metal layer 2/growth substrate 1 is covered with the holder 11 and the lid 13.

The third difference lies in that an attempt is made to allow the growth substrate 1 and the source-supporting substrate 4 to stand still, specifically, the spacer 12 supports the growth substrate 1 (the source-supporting substrate 4 having the carbon-containing layer 3 arranged thereon in the case where the arrangement order is opposite), and the holder 11 supports the entire four-layer structure.

As described later, the spacer 12, the holder 11, and the lid 13 have only to be ones capable of resisting heat treatment, and at least one is selected mainly from the following five groups.

The first group includes oxides, such as quartz ($SiO_2$), alumina or sapphire ($Al_2O_3$), titanium oxide ($TiO_2$), zinc oxide (ZnO), magnesium oxide (MgO), nickel oxide (NiO), zirconia ($ZrO_2$), lithium niobate ($LiNbO_3$), and lithium tantalate ($LiTaO_3$).

The second group includes nitrides, such as boron nitride (BN), aluminum nitride (AlN), gallium nitride (GaN), carbon nitride ($C_3N_4$), and boron carbon nitride (BCN).

The third group includes carbides, such as silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), and tungsten carbide (WC).

The fourth group includes fluorides, such as barium fluoride ($BaF_2$), calcium fluoride ($CaF_2$), and magnesium fluoride ($MgF_2$).

The fifth group includes other heat-resistant materials, such as mica and diamond.

It should be noted that, from the viewpoint of material cost, for example, a sintered body of quartz glass, alumina, or boron nitride is inexpensive and practical.

A method of manufacturing the graphene substrates 10a, 10b according to the second embodiment is hereinafter described with reference to FIG. 4.

It should be noted that, in the second embodiment, components having the same functions as those of the components in the first embodiment are denoted with the same reference symbols as those therein, and the descriptions thereof are omitted.

First, as illustrated in FIG. 4(a), the holder 11 is prepared.

As illustrated in FIG. 4(a), the holder 11 has a box shape having a concave portion formed at the center, and the dimensions and shape of the concave portion correspond to those of the source-supporting substrate 4 and the growth substrate 1.

The holder 11 cooperates with the lid 13 to prevent the metal layer 2 from being evaporated during heating and to support the entire four-layer structure (including the spacer 12) of source-supporting substrate 4/carbon-containing layer 3/metal layer 2/growth substrate 1.

Second, as illustrated in FIG. 4(b), the source-supporting substrate 4 having the carbon-containing layer 3 arranged thereon in advance is arranged in the holder 11.

Third, as illustrated in FIG. 4(c), the spacer 12 is arranged on the carbon-containing layer 3/source-supporting substrate 4.

As illustrated in FIG. 4(c), the spacer 12 has a plate-like shape having a center portion hollowed out, and the dimensions and shape of the spacer 12 correspond to those of the source-supporting substrate 4 and the growth substrate 1.

The spacer 12 has a function of preventing the metal layer 2 from flowing in the horizontal direction as well as a function of supporting the growth substrate 1.

Fourth, as illustrated in FIG. 4(d), the metal layer 2 is arranged in the spacer 12 so as to come into close contact with the carbon-containing layer 3/source-supporting substrate 4.

It should be noted that the amount of the metal layer 2 is adjusted in advance so as to ensure the sufficient contact with the growth substrate 1 described below.

Fifth, as illustrated in FIG. 4(e), the growth substrate 1 is arranged so as to come into close contact with the metal layer 2.

Accordingly, the four-layer structure of source-supporting substrate 4/carbon-containing layer 3/metal layer 2/growth substrate 1 is formed. It should be noted that, even in the case where the order of the four-layer structure is opposite, that is, in the case of the four-layer structure of growth substrate 1/metal layer 2/carbon-containing layer 3/source-supporting substrate 4, the effects described later are the same.

Sixth, as illustrated in FIG. 4(f), the lid 13 is arranged on the growth substrate 1.

As illustrated in FIG. 4(f), the lid 13 has a plate-like shape having a convex portion formed at the center. The dimensions and shape of the convex portion correspond to those of the source-supporting substrate 4 and the growth substrate 1, and the thickness of the convex portion is adjusted so that the convex portion comes into sufficient contact with the four-layer structure.

The lid 13 serves as a weight to prevent the metal layer 2 from flowing, and cooperates with the holder 11 to prevent the metal layer 2 from being evaporated during heating.

Seventh, as illustrated in FIG. 4(g), the graphene 9 is formed by heating and cooling.

According to the observation during heating, it is confirmed that, as compared to the first embodiment, the spacer 12 has an effect of preventing the metal layer 2 from flowing or outflowing in the horizontal direction.

Further, in the case of the first embodiment, during heating, the growth substrate 1 (source-supporting substrate 4 having the carbon-containing layer 3 arranged thereon in the case of the opposite order) is unstable in a floated state on the metal layer 2, whereas in the case where the spacer 12 is present, the effect that the growth substrate 1 (source-supporting substrate 4 having the carbon-containing layer 3 arranged thereon in the case of the opposite order) is firmly fixed by the spacer 12 is confirmed.

Further, it is confirmed that, as compared to the first embodiment, the evaporation of the metal layer 2 during heating is remarkably reduced by virtue of the presence of the holder 11 and the lid 13. Further, it is confirmed that the holder 11 has an effect of firmly fixing the four-layer structure.

Eighth, as illustrated in FIG. 4(h), the graphene substrates 10a, 10b are obtained by removing the metal layer 2 by the same method as that of the first embodiment.

As described above, the metal layer 2 is brought into contact with the carbon-containing layer 3 and the growth substrate 1 simultaneously, and the resultant is heated to dissolve the carbon 5 in the carbon-containing layer 3 into the metal layer 2. Then, the resultant is cooled to precipitate the carbon 5 in the metal layer 2 as the graphene 9 on the surfaces of the growth substrate 1 and the source-supporting substrate 4. Thus, the graphene substrates 10a, 10b are manufactured.

Accordingly, the second embodiment exhibits the same effects as those of the first embodiment.

Further, by adding the holder 11, the spacer 12, and the lid 13, as compared to the first embodiment, the effect of preventing the metal layer 2 from outflowing or flowing, the effect of reducing the evaporation of the metal layer 2 during heating, and the effect of allowing the growth substrate 1 and the source-supporting substrate 4 to stand still are obtained.

Thus, according to the second embodiment, the metal layer 2 is brought into contact with the carbon-containing layer 3 and the growth substrate 4 simultaneously through intermediation of the spacer 12, and the entire four-layer structure including the spacer 12 is heated while being covered with the holder 11 and the lid 13 to dissolve the carbon 5 in the carbon-containing layer 3 into the metal layer 2 while preventing the evaporation of the metal layer 2. Then, the resultant is cooled to precipitate the carbon 5 in the metal layer 2 as the graphene 9 on the surfaces of the growth substrate 1 and the source-supporting substrate 4. Thus, the graphene substrates 10a, 10b are manufactured.

Next, the third embodiment is described.

In the third embodiment, the graphene 9 is formed on the surfaces of the growth substrates 1 having various surface shapes in the first and second embodiments.

Figure 5:
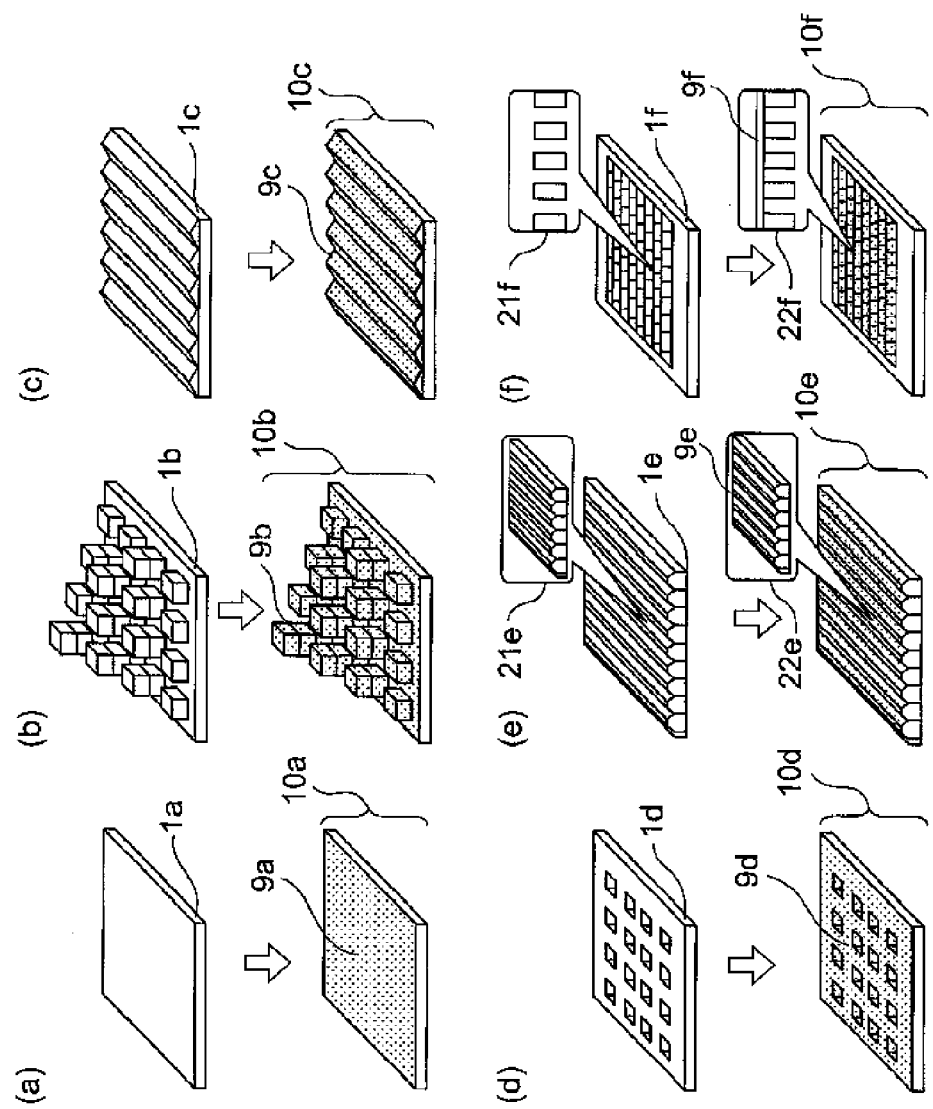
FIG. 5 is perspective views each illustrating a detail of a method of manufacturing a graphene substrate according to a third embodiment.

A substrate 1a illustrated in FIG. 5(a) has a planar shape similar to that of the growth substrate 4 used in the first and second embodiments, that is, a flat planar shape. Substrates 1a, 1b, 1c, . . . , used for growing graphene, are collectively referred to as the growth substrate 1. In the growth substrates, different alphabet symbols attached to the reference number of 1 represent that the growth substrates are different from each other in bodies or materials. In addition, graphenes 9a, 9b, 9c, . . . are collectively referred to as graphene 9. In graphenes, different alphabet symbols attached to the reference number of 9 represent that graphenes are different from each other in bodies, shapes, or materials.

Therefore, a flat graphene substrate 10a having flat graphene 9a is obtained from the flat substrate 1a by the method described in the first and second embodiments.

On the other hand, a graphene substrate 10b having a convex three-dimensional structure is obtained in FIG. 5(b), a graphene substrate 10c having a wave-shaped (uneven) three-dimensional structure is obtained in FIG. 5(c), and a graphene substrate 10d having a concave three-dimensional structure is obtained in FIG. 5(d).

In this case, in FIGS. 5(b) to 5(d), when the three-dimensional structure is as sufficiently large as 100 μm or more, the liquefied metal layer 2 can come into contact with all the surfaces of the growth substrates 1b to 1d, and hence all the surfaces of each three-dimensional structure are formed into graphene.

Further, on the other hand, in FIGS. 5(e) and 5(f), when the periodic dimension of the three-dimensional structure is as small as about 100 μm or less, the liquefied metal layer 2 cannot come into contact with all the surfaces of each three-dimensional structure of the growth substrates 1a and 1d.

This is caused by the interfacial tension of a metal forming the metal layer 2.

Therefore, for example, in the case of FIG. 5(e), as illustrated in an enlarged view 21e, only an apex portion (convex portion) of each mountain in a wave-shaped (uneven) structure of the growth substrate 1e is formed into graphene. Therefore, as illustrated in an enlarged view 22e of a graphene substrate 10e, the graphene substrate 10e capped with strip-shaped graphene 9e is obtained.

Further, in the case of FIG. 5(f), as illustrated in an enlarged view 21f, a liquefied flux cannot permeate the inside of each mesh structure and comes into contact with only the surface of the mesh structure. In this case, the period of the mesh structure is sufficiently small, and hence formation of graphene proceeds so as to cross-link meshes (concave portions). As a result, as illustrated in an enlarged view 22f, a graphene substrate 10f having a mesh structure covered with two-dimensional periodic graphene 9f is obtained.

As described above, according to the third embodiment, various graphene elements described later can be produced through use of the graphene substrates 10a to 10f.

Next, a fourth embodiment is described.

In the fourth embodiment, a field effect transistor 37 is manufactured through use of the graphene substrate 10 according to the first embodiment.

It should be noted that, in the fourth embodiment, components having the same functions as those of the components in the first embodiment are denoted with the same reference symbols as those therein, and the descriptions thereof are omitted.

A manufacturing method for the field effect transistor 37 according to the fourth embodiment is hereinafter described with reference to FIG. 6.

In this case, a procedure for manufacturing the field effect transistor 37 having the graphene 9 as a channel through use of a standard lithography technology is illustrated.

First, as illustrated in FIG. 6(a), the growth substrate 1 is prepared, and the graphene substrate 10 having the growth substrate 1 covered with the graphene 9 is obtained by the method according to the first embodiment, as illustrated in FIG. 6(b).

Second, a mask 31 is formed by resist coating, lithography exposure, and wet etching, as illustrated in FIG. 6(c).

Third, the graphene 9 not covered with the mask 31 is subjected to dry etching with oxygen plasma to obtain source/drain electrode contact portions 32 and a graphene channel 33 made of the graphene 9, as illustrated in FIG. 6(d).

Fourth, as illustrated in FIG. 6(e), source/drain electrodes 34 are formed by vapor deposition through use of an appropriate metal material.

Fifth, as illustrated in FIG. 6(f), a gate insulator 35 is formed by vapor deposition through use of an appropriate insulating material.

Sixth, as illustrated in FIG. 6(g), a gate electrode 36 is formed on the gate insulator 35 by vapor deposition through use of an appropriate metal material to finally obtain the field effect transistor 37 having the graphene 9 as a channel.

Figure 6:
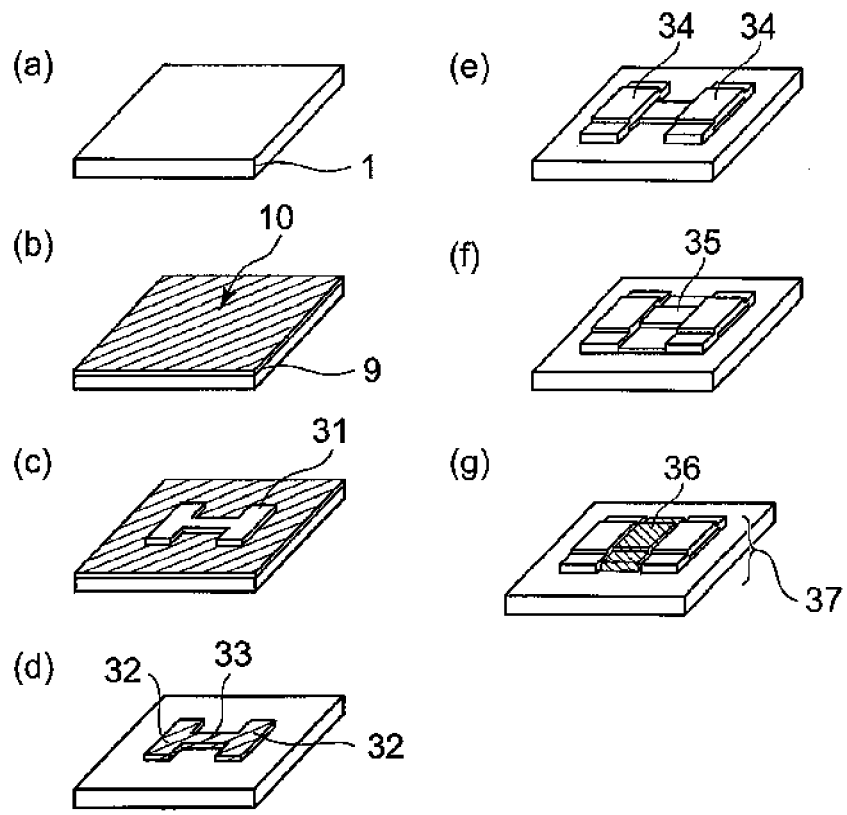
FIG. 6 is perspective views each illustrating a detail of a method of manufacturing a graphene substrate according to a fourth embodiment.

It should be noted that FIG. 6 illustrate an example in which the field effect transistor 37 is produced from the flat graphene substrate 10a of FIG. 5(a), but various graphene elements can be obtained from the graphene substrates 10b to 10f having various surface structures of FIGS. 5(b) to 5(f), respectively.

For example, semiconductor devices in the mechanoelectronics field typified by micro electro mechanical systems (MEMS) and nano electro mechanical systems (NEMS) including a combination of electronic circuits with mechanical element components, sensors, and actuators can be obtained from the graphene substrates 10b to 10d having a three-dimensional structure illustrated in 5(b) to 5(f), respectively.

Further, semiconductor devices in the optoelectronics field such as amplifiers, transmitters, light sources, lasers, and super high-speed broad band information communication equipment can be obtained from the graphene substrates 10c to 10f having a periodic structure of FIGS. 5(b) to 5(f), respectively, in the case where the periods thereof are about in a wavelength from a far infrared radiation to a terahertz electromagnetic wave band.

Further, semiconductor devices in the environment and energy field such as solar cells, energy-saving light-emitting diode illuminators, and thermoelectric conversion elements can be obtained from the graphene substrates 10e and 10f having a fine periodic structure of FIGS. 5(b) to 5(f), respectively.

EXAMPLES

This invention is hereinafter described in more detail by way of Examples.

Example 1

The example shown below relates to a relationship between the quality of graphene and the heating time.

Figure 4:
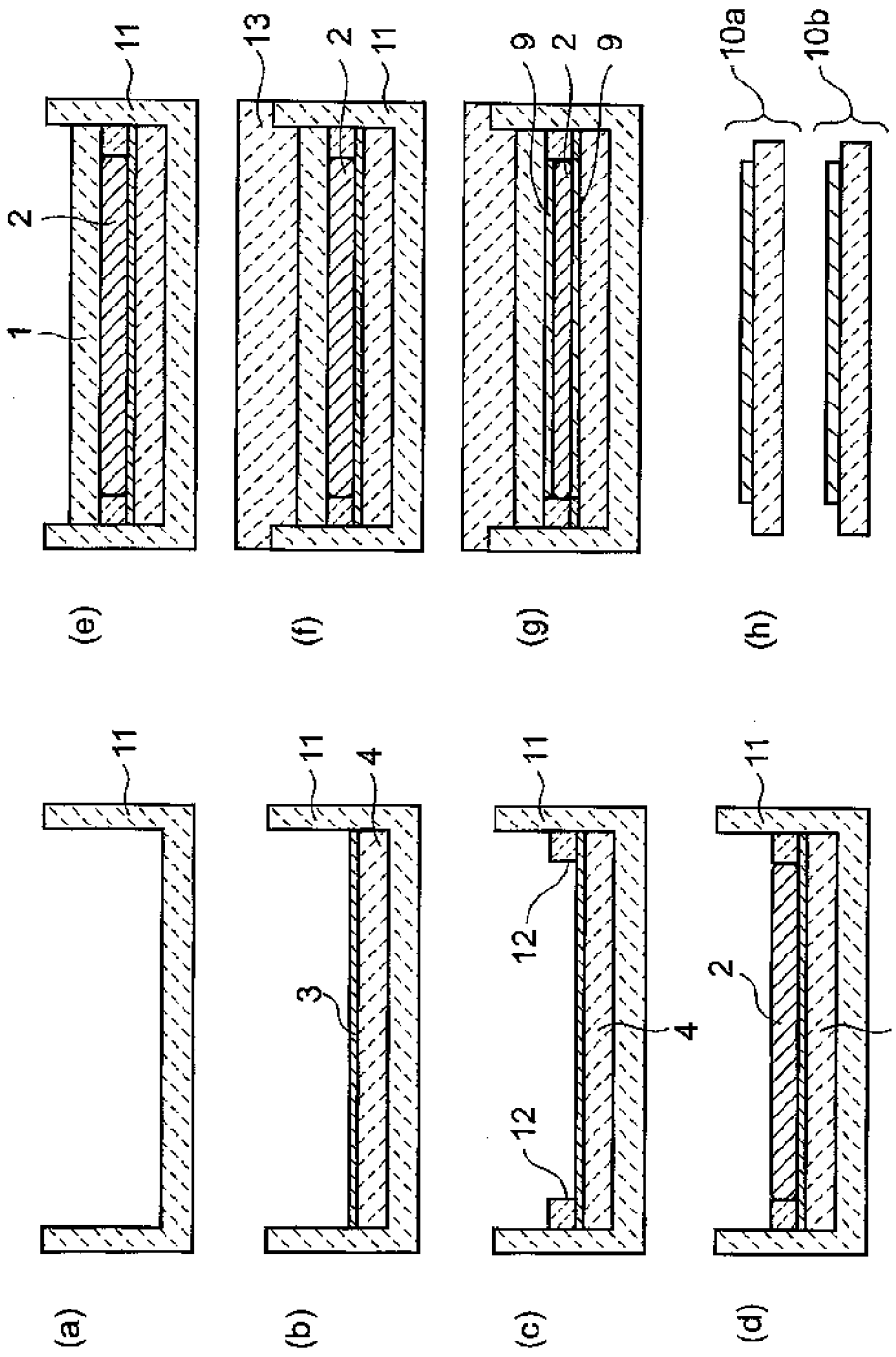
FIG. 4 is sectional views each illustrating a detail of a method of manufacturing a graphene substrate according to a second embodiment.

The graphene substrate 10 was produced at various heating temperatures by the method illustrated in FIG. 4. Raman spectra of the obtained graphene 9 were measured to determine a D/G ratio indicating graphene quality. A specific procedure therefor is as follows.

First, the graphene substrate 10 was produced at various heating temperatures by the method illustrated in FIG. 4. A quartz glass substrate was used as the growth substrate 1, a gallium-aluminum alloy was used as the metal layer 2, and plate-like glassy carbon was used as the carbon-containing layer 3. Heating was performed under vacuum in an electric furnace, the heating temperature was 500, 600, 700, 800, 900, 1,000, or 1,100° C., and the cooling rate fell within a range of 1 to 7° C./min.

Second, the metal layer 2 (gallium aluminum was subjected to chemical treatment by being soaked in concentrated hydrochloric acid at 80° C. for about 15 minutes, and the graphene substrate 10 produced at each heating temperature was washed with pure water, acetone, and isopropyl alcohol in the stated order and dried by nitrogen ($N_2$) blowing.

Third, Raman spectra were obtained from the graphene 9 on the graphene substrate 10 produced at each heating temperature in several regions of the same sample. The Raman spectra were measured through use of a micro Raman spectrometer, with a wavelength of Raman excitation laser being 532 nm and a laser power being 10 mW or less. Some Raman spectra were averaged to determine a D/G ratio.

Figure 7:
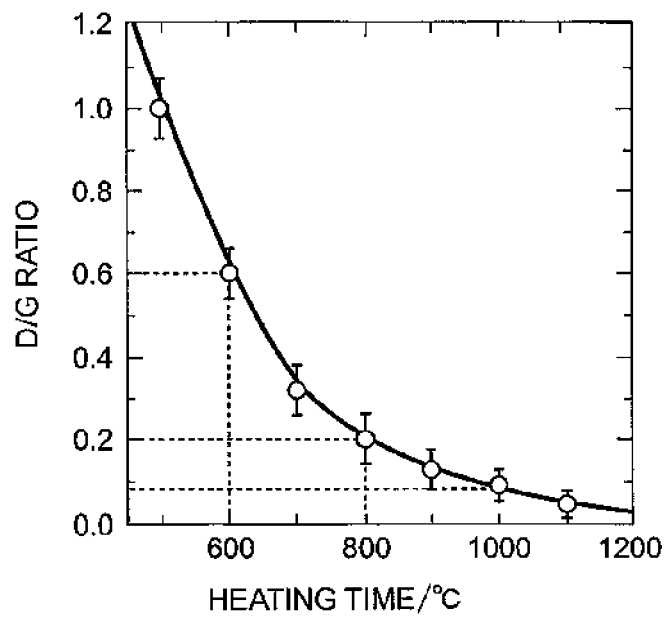
FIG. 7 is a graph showing a relationship between the quality of graphene and a heating condition at the time of manufacturing a graphene substrate according to Example 1.

FIG. 7 is a graph showing a relationship between the D/G ratio of the graphene 9 produced by the above-mentioned method and the heating temperature. As shown in FIG. 7, as the heating temperature rises, the D/G ratio decreases. That is, it was observed that the quality of the graphene 9 tended to be enhanced with an increase in temperature. In the case where the heating temperature was 600° C., the D/G ratio was about 0.6, and hence the quality of graphene was remarkably low. However, in some regions, the D/G ratio was 0.2 or less. Thus, it was confirmed that graphene of desired quality was present in some regions on the graphene substrate 10. It should be noted that, when the heating temperature was 800° C., the D/G ratio was about 0.2, and when the heating temperature was 1,000° C., the D/G ratio was about 0.1. Thus, the following was found: the lowest heating temperature of graphene growth was 600° C.; graphene of high quality was obtained at a heating temperature of 800° C. or more; and graphene of higher quality was obtained at a heating temperature of 1,000° C. or more.

As described above, according to this invention, it is verified that the graphene substrate 10 can be manufactured by setting the heating temperature to 600° C. or more, desirably 800° C., more desirably 1,000° C. or more.

Example 2

The example shown below relates to the control of the number of layers of graphene by adjusting the amount of carbon.

The graphene substrates 10a, 10b were produced with the amount of carbon in the carbon-containing layer 3 being adjusted by the method illustrated in FIG. 4. The Raman spectra of the obtained graphene 9 were measured, and the quality and the number of layers of graphene were evaluated. A specific procedure therefor is as follows.

First, a toluene solution of $C_{60}$ fullerene was prepared and applied dropwise onto five separate quartz glass substrates so as to obtain the amounts of carbon corresponding to twice the following number of layers of graphene: one layer; two layers; three layers; four layers; and ten layers, respectively.

Second, the method illustrated in FIG. 4 was applied to each of the five kinds of $C_{60}$-coated substrates thus produced to produce the graphene substrates 10a, 10b. A sapphire substrate was used as the growth substrate 1, gallium was used as the metal layer 2, a $C_{60}$-coated layer was used as the carbon-containing layer 3, and a quartz glass substrate was used as the source-supporting substrate 1. Heating was performed under vacuum in an electric furnace, the heating temperature was 1,100° C., and the cooling rate was about 2° C./min.

Third, the metal layer 2 (gallium) was subjected to chemical treatment by being washed in concentrated hydrochloric acid at 80° C. for about 15 minutes, and the graphene substrates 10a, 10b produced through use of the respective amounts of carbon were washed with pure water, acetone, and isopropyl alcohol in the stated order and dried by nitrogen ($N_2$) blowing.

Fourth, Raman spectra of the graphene 9 on the graphene substrates 10a, 10b produced through use of the respective amounts of carbon were obtained. The Raman spectra were measured through use of a micro Raman spectrometer, with a wavelength of Raman excitation laser being 532 nm and a laser power being 10 mW or less.

Figure 8:
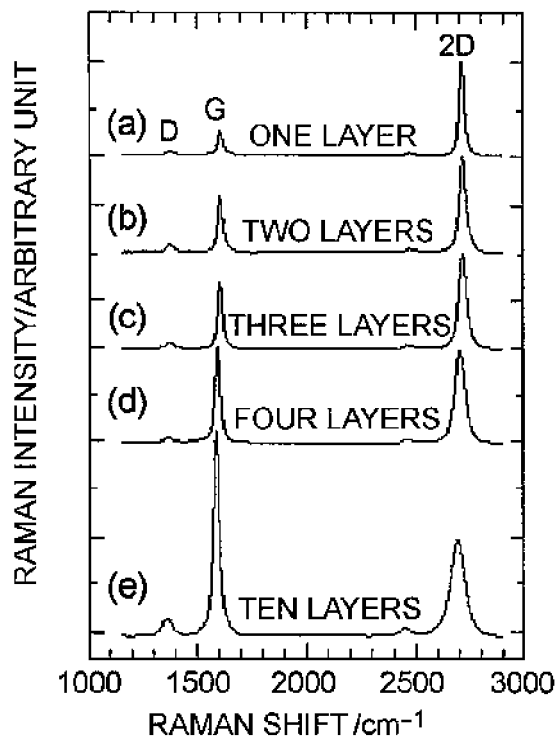
FIG. 8 is a graph showing Raman spectra of graphene in the case of changing the amount of a carbon-containing layer at the time of manufacturing a graphene substrate according to Example 2.

FIG. 8 shows Raman spectra of the graphene 9 on the growth substrates 1 (sapphire substrates) produced through use of the amounts of carbon corresponding to the following number of layers of graphene: (a) one layer; (b) two layers; (c) three layers; (d) four layers; and (e) ten layers, respectively. Each G/D ratio is about 0.1, and hence the produced graphene 9 is of very high quality. According to the literature, the Raman spectra (a) to (e) are identified to be those of one layer, two layers, three layers, four layers, and ten layers, respectively. Further, separately, when visible absorption spectra were measured through use of an optical microscope, the results supporting the above-mentioned identification were obtained.

It should be noted that similar results were also obtained from the graphene 9 on the source-supporting substrate 4 (quartz glass substrate). That is, it can be interpreted that $C_{60}$ as a carbon source was temporarily dissolved in an entire amount as the carbon 5 into the metal layer 2 (gallium) by heating, and the carbon 5 derived from $C_{60}$ was precipitated as the graphene 9 on the growth substrate 1 and the source-supporting substrate 4 on a fifty-fifty basis by cooling.

As described above, according to this invention, it is verified that the graphene substrate 10 of high quality can be manufactured while controlling the number of layers of graphene by adjusting the amount of carbon in the carbon-containing layer 3.

Example 3

The example shown below relates to the graphene substrate 10 produced through use of various carbon-containing materials as the carbon-containing layer 3.

The graphene substrate 10 was produced through use of natural graphite, a single-walled carbon nanotube, glassy carbon, nanodiamond, $C_{60}$ fullerene, and nickelocene ($[(C_5H_5)_2]Ni$) as the carbon-containing layer 3 by the method illustrated in FIGS. 4A to 4F. Raman spectra of the graphene 9 thus obtained were measured, and the quality of the graphene was evaluated. A specific procedure therefor is as follows.

First, the natural graphite/source-supporting substrate 4 was produced by mechanically peeling a graphite thin film from a natural graphite surface layer through use of an adhesive tape, and attaching the graphite thin film to a sapphire substrate. As the growth substrate 1, a sapphire substrate was used.

Second, the single-walled carbon nanotube/source-supporting substrate 4 was produced by preparing a suspension of a single-walled carbon nanotube in 1,2-dichloroethane, and applying the suspension onto a sapphire substrate by spin coating. As the growth substrate 1, a sapphire substrate was used.

Third, the same method as that of Example 1 was used in the case of glassy carbon.

Fourth, the nanodiamond/source-supporting substrate 4 was produced by preparing a suspension of nanodiamond in ethanol, and applying the suspension onto a quartz glass substrate by spin coating. As the growth substrate 1, a quartz glass substrate was used.

Fifth, the same method as that of Example 2 was used in the case of $C_{60}$.

Sixth, the nickelocene/source-supporting substrate 4 was produced by preparing a solution of nickelocene in chloroform, and applying the solution dropwise onto a quartz glass substrate. As the growth substrate 1, a quartz glass substrate was used.

Seventh, the method illustrated in FIG. 4 was applied to the carbon-containing layer 3/source-supporting substrate 4 thus produced or the carbon-containing layer 3 to produce the graphene substrate 10. As the metal layer 2, gallium was used. Heating was performed under an argon (Ar) stream in an electric furnace, the heating temperature was 600 to 1,000° C., and the cooling rate was about 1 to 5° C./min.

Eighth, the metal layer 2 (gallium) was subjected to chemical treatment by being soaked in concentrated hydrochloric acid at 80° C. for about 15 minutes, and each of the graphene substrates 10 was washed with pure water, acetone, and isopropyl alcohol in the stated order and dried by nitrogen ($N_2$) blowing.

Ninth, Raman spectra were obtained from the graphene 9 on each of the graphene substrates 10. The Raman spectra were measured through use of a micro Raman spectrometer, with a wavelength of Raman excitation laser being 532 nm and a laser power being 10 mW or less.

Figure 9:
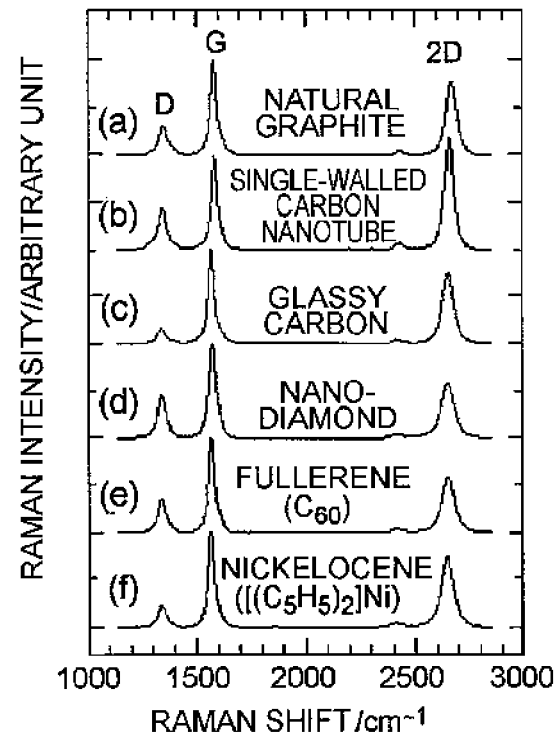
FIG. 9 is a graph showing Raman spectra of graphene in the case of changing the kind of a carbon-containing layer at the time of manufacturing a graphene substrate according to Example 3.

FIG. 9 shows Raman spectra of the graphene 9 on the graphene substrates 10 produced through use of (a) natural graphite, (b) a single-walled carbon nanotube, (c) glassy carbon, (d) nanodiamond, (e) $C_{60}$ fullerene, and (f) nickelocene as the carbon-containing layer 3. The G/D ratio is about 0.15 to 0.4, and the number of layers of graphene is about 4 to 6. It should be noted that the variations of the G/D ratio and the number of layers are caused by differences in heating temperature and cooling rate between the respective cases. When graphene is manufactured under the same condition, the difference in carbon source does not influence the quality of the graphene 9. Thus, it was found that the graphene 9 was able to be grown on an insulating substrate through use of various carbon sources as the carbon-containing layer 3.

As described above, according to this invention, it is verified that the graphene substrate 10 can be manufactured through use of various carbon materials as a source for the carbon-containing layer 3.

Example 4

The example shown below relates to the graphene substrate 10 produced on various insulating substrates.

The graphene 9 was grown on a (001) plane diamond substrate, a (0001) plane (silicon plane) 4H—SiC substrate, a (000-1) plane (carbon plane) 6H—SiC substrate, a (0001) plane h-BN (hexagonal boron nitride) substrate, a (0001) plane (C plane) sapphire substrate, and a quartz glass substrate by the method illustrated in FIG. 4 to produce the respective graphene substrates 10. Raman spectra of the obtained graphene 9 were measured, and the quality of the graphene was evaluated. A specific procedure therefor is as follows.

First, in the case of the diamond substrate, the 4H—SiC substrate, and the 6H—SiC substrate, each of those substrates itself serves as a carbon supply source and also serves as a substrate for graphene growth. In this case, the metal layer 2 was arranged on the substrate, and the graphene substrate 10b was produced by the method illustrated in FIG. 4.

Second, in the case of the h-BN substrate, a surface layer of an h-BN single crystal was peeled mechanically, and the peeled single crystal thin film was attached to the (1000) plane (silicon plane) 6H—SiC substrate. It should be noted that, in this case, the 6H—SiC substrate serves as a carbon supply source, and the h-BN single crystal thin film serves as a substrate for graphene growth.

Third, in the case of the sapphire substrate, glassy carbon was used as the carbon-containing layer 3.

Fourth, in the case of the quartz glass substrate, the same method as that of Example 2 was used.

Fifth, the method illustrated in FIG. 4 was applied to various substrates produced by the above-mentioned method to produce the graphene substrates 10. As the metal layer 2, gallium was used. Heating was performed under vacuum in an electric furnace, the heating temperature was 900 to 1,100° C., and the cooling rate was about 0.5 to 5° C./min.

Sixth, the metal layer 2 (gallium) was subjected to chemical treatment by being washed in concentrated hydrochloric acid at 80° C. for about 15 minutes, and each of the graphene substrates 10 was washed with pure water, acetone, and isopropyl alcohol in the stated order and dried by nitrogen ($N_2$) blowing.

Seventh, Raman spectra of the graphene 9 on each of the graphene substrates 10 were obtained. The Raman spectra were measured through use of a micro Raman spectrometer with a wavelength of Raman excitation laser being 532 nm and a laser power being 10 mw or less.

Figure 10:
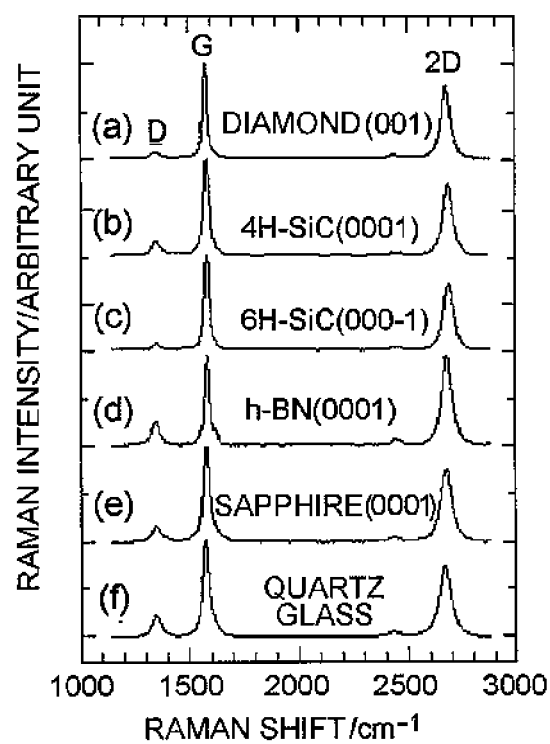
FIG. 10 is a graph showing Raman spectra of graphene in the case of changing the kind of a growth substrate at the time of manufacturing a graphene substrate according to Example 4.

FIG. 10 shows Raman spectra of the graphene 9 produced on the diamond substrate (a), the 4H—SiC substrate (b), the 6H—SiC substrate (c), the h-BN thin film substrate (d), the sapphire substrate (e), and the quartz glass (f). The G/D ratio was very low, i.e., about 0.1 to 0.2. The number of layers of the graphene was about 5. Thus, in any case, it was confirmed that the graphene 9 of very high quality was formed on the insulating substrate.

As described above, according to this invention, it is verified that the graphene substrate 10 of high quality can be manufactured on various insulating substrates.

Example 5

The example shown below relates to the graphene substrate 10 produced through use of various metal materials as the metal layer 2.

The graphene substrates 10 were produced by growing the graphene 9 through use of gallium or a gallium-indium alloy as the metal layer 2 by the method illustrated in FIG. 4. Raman spectra of the graphene 9 thus obtained were measured, and the quality of the graphene was evaluated. A specific procedure therefor is as follows.

First, the graphene substrate 10 was produced through use of gallium or a gallium-indium alloy as the metal layer 2 by the method illustrated in FIG. 4. A quartz glass substrate was used as the growth substrate 1, and plate-like glassy carbon was used as the carbon-containing layer 3. Heating was performed under an argon stream in an electric furnace, the heating temperature was 800° C., and the cooling rate was about 20° C./min.

Second, the metal layer 2 was subjected to chemical treatment by being washed in concentrated hydrochloric acid at 80° C. for about 15 minutes, and the graphene substrate 10 produced at each heating temperature was washed with pure water, acetone, and isopropyl alcohol in the stated order and dried by nitrogen ($N_2$) blowing.

Third, Raman spectra were obtained from the graphene 9 on the graphene substrate 10 produced through use of each of the metal layers 2. The Raman spectra were measured through use of a micro Raman spectrometer with Raman excitation laser having a wavelength of 532 nm and a laser power of 10 mw or less.

Figure 11:
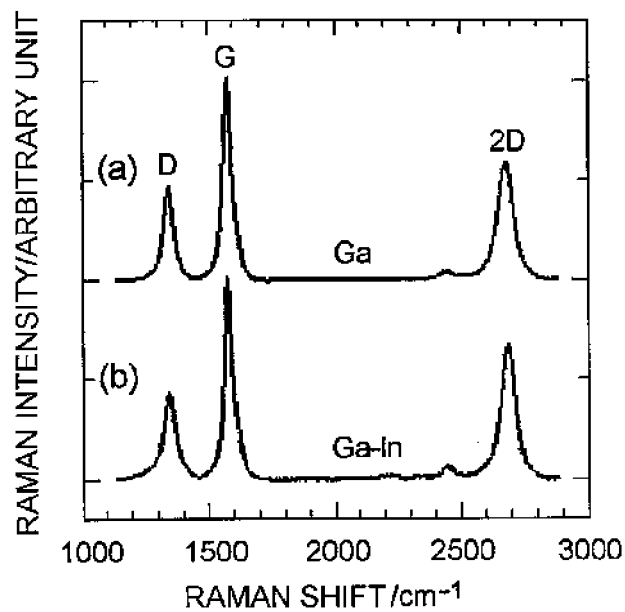
FIG. 11 is a graph showing Raman spectra of graphene in the case of changing the kind of a metal layer at the time of manufacturing a graphene substrate according to Example 5.

FIG. 11 shows Raman spectra of the graphene 9 produced through use of the gallium (a) and the gallium-indium alloy (b) as the metal layer 2. The G/D ratio is about 0.4, and the number of layers of graphene is about 6. Thus, it was confirmed that the graphene 9 was formed on the insulating substrate even when the kind of the metal layer 2 was changed.

As described above, according to this invention, it is verified that the graphene substrate 10 can be manufactured through use of various metal layers 2.

Example 6

The example shown below relates to device fabrication through use of the graphene substrate 10.

The graphene 9 was produced on a (0001) plane 6H—SiC substrate and a (0001) plane single crystal silicon oxide ($SiO_2$) by the method illustrated in FIG. 4, and the field effect transistors 37 each including the graphene 9 as a channel were produced by the method illustrated in FIG. 6. Both the transistors were subjected to electrical measurement to evaluate device characteristics. A specific procedure therefor is as follows.

First, a production method for the graphene substrate 10 is the same as those of Examples 1 to 5. It should be noted that, in the case of the single crystal $SiO_2$ substrate, a Teflon thin film was used as the carbon-containing layer 3.

Second, the field effect transistor 37 using the graphene substrate 10 was produced as illustrated in FIG. 6.

Third, the field effect transistor 37 including the graphene 9 as a channel produced as described above was evaluated for conduction characteristics at room temperature through use of a prober and a semiconductor parameter analyzer.

In the graphene transistor produced on any of the 6H—SiC substrate and the single crystal $SiO_2$ substrate, the gate voltage dependence of a drain current (transfer characteristics) exhibited such ambipolar conduction typical of graphene that the drain current becomes minimum at a Dirac point in the vicinity of 0 V, and the drain current increases even when a gate voltage is swept on a minus side or a plus side.

Thus, according to the method of this invention, it was verified that a semiconductor element made of graphene was able to be manufactured.

Example 7

The example shown below relates to the graphene substrate 10 which has been doped, and device fabrication using the same.

By adding a dopant introducing step to the method illustrated in FIG. 4, p-type graphene and n-type graphene were grown on insulating substrates to produce p-type and n-type graphene substrates.

Then, the field effect transistors 37 including the p-type graphene and the n-type graphene as channels were produced by the method illustrated in FIG. 6. Both the transistors were subjected to electrical measurement to evaluate device characteristics. A specific procedure therefor is as follows.

First, basic conditions for producing the p-type and n-type graphene substrates are similar to those of Examples 1 to 5. Differences are as follows. First, for producing p-type graphene, glassy carbon containing a trace amount of boron (B) as an acceptor element was used as the carbon-containing layer 3. Further, for producing n-type graphene, glassy carbon containing a trace amount of nitrogen (N) as a donor element was used as the carbon-containing layer 3. It should be noted that a single crystal $SiO_2$ substrate was used as the growth substrate 1, and gallium was used as the metal layer 2.

Second, the field effect transistors 37 using the p-type and n-type graphene substrates obtained as described above are produced as illustrated in FIG. 6.

Third, the field effect transistors 37 including the p-type graphene and n-type graphene as channels produced as described above were evaluated for conduction characteristics at room temperature through use of a prober and a semiconductor parameter analyzer.

As a result of the measurement of the transfer characteristics, in the case of the graphene transistor produced from the graphene doped with boron, ambipolar conduction became asymmetrical, and the p-type conduction became dominant. On the other hand, in the case of the graphene transistor produced from the graphene doped with nitrogen, ambipolar conduction became asymmetrical, and the n-type conduction became dominant. The results mean that the p-type graphene can be grown by boron doping, and the n-type graphene can be grown by nitrogen doping. The results also mean that the use of the respective graphene substrates enables transistors including the p-type graphene channel and the n-type graphene channel to be produced.

Thus, according to the method of this invention, it was verified that the p-type and n-type graphene substrates were able to be produced, and semiconductor elements thereof were able to be manufactured.

In the foregoing, although the embodiments and examples of this invention are described specifically, this invention is not limited thereto and can be modified variously based on the technical idea of this invention.

For example, in this embodiment, although the case where a field effect transistor is manufactured through use of a graphene substrate is described, this invention is not limited thereto. For example, this invention is also capable of manufacturing semiconductor devices in the electronics field such as logic circuits, memory device circuits, and analog/digital (AD) converters.

INDUSTRIAL APPLICABILITY

As described above, the graphene substrate according to this invention can be applied to semiconductor devices to be used in various electric devices and electronic devices.

This application claims priority from Japanese Patent Application No. 2010-284021, filed on Dec. 21, 2010, the entire disclosure of which is incorporated herein by reference.

REFERENCE SIGNS LIST 1 growth substrate
2 metal layer
3 carbon-containing layer
4 source-supporting substrate
5 carbon
6 other elements
9, 9a graphene
9b, 9c, 9d three-dimensional graphene
9e strip-shaped graphene
9f two-dimensional periodic graphene
10a, 10b, 10c, 10d, 10e, 10f graphene substrate
11 holder
12 spacer
13 lid
31 mask
32 source/drain electrode contact portion
33 graphene channel
34 source/drain electrode
35 gate insulator
36 gate electrode
37 field effect transistor

The invention claimed is:

1. A method of manufacturing a graphene substrate, comprising the steps of:
   (a) bringing a metal layer into contact with a carbon-containing layer and heating the metal layer to dissolve carbon in the carbon-containing layer into the metal layer; and
   (b) cooling the metal layer to precipitate the carbon in the metal layer as graphene on a surface of a heat-resistant material brought into contact with the metal layer to allow the metal layer to become liquid and to dissolve carbon in the carbon-containing layer into the metal layer,
   wherein the metal layer comprises a metal having a carbon solubility at a ppm level and a relatively low melting point to be liquid in a heating temperature range between 600° C. and 1200° C., and wherein (b) further comprises keeping the metal layer at a constant temperature between 400° C. and 600° C.

2. The method according to claim 1, further comprising (c) removing the metal layer after (b).

3. The method according to claim 2, wherein:
   (a) includes dissolving an acceptor element or a donor element into the metal layer together with the carbon; and
   (b) includes precipitating the acceptor element as p-type graphene or precipitating the donor element as n-type graphene, together with the carbon.

4. The method according to claim 3, wherein:
   the acceptor element includes at least one element selected from the group consisting of group 2 elements and group 13 elements; and
   the donor element includes at least one element selected from the group consisting of group 15 elements and group 16 elements, said groups are defined by Periodic table.

5. The method according to claim 4, wherein:
   the group 2 elements include beryllium (Be) and magnesium (Mg);

the group 13 elements include boron (B) and aluminum (Al);

the group 15 elements include nitrogen (N), phosphorus (P), arsenic (As), and antimony (Sb); and the group 16 elements include sulfur (S), selenium (Se), and tellurium (Te).

6. The method according to claim 1, wherein the metal layer includes at least one selected from the group consisting of gallium (Ga), indium (In), thallium (Tl), tin (Sn), aluminum (Al), lead (Pb), bismuth (Bi), zinc (Zn), cadmium (Cd), and mercury (Hg).

7. The method according to claim 1, wherein the heat-resistant material comprises at least one element or compound selected from the group consisting of an oxide, a nitride, a carbide, a fluoride, mica, and diamond.

8. The method according to claim 7, wherein:

the oxide is selected from the group consisting of quartz ($SiO_2$), at least one kind of alumina and sapphire ($Al_2O_3$), titanium oxide ($TiO_2$), zinc oxide (ZnO), magnesium oxide (MgO), nickel oxide (NiO), zirconia ($ZrO_2$), lithium niobate ($LiNbO_3$), and lithium tantalate ($LiTaO_3$);

the nitride includes at least one kind selected from the group consisting of boron nitride (BN), aluminum nitride (AlN), gallium nitride (GaN), carbon nitride ($C_3N_4$), and boron carbon nitride (BCN);

the carbide includes at least one kind selected from the group consisting of silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), and tungsten carbide (WC); and the fluoride includes at least one selected from the group consisting of barium fluoride ($BaF_2$), calcium fluoride ($CaF_3$), and magnesium fluoride ($MgF_2$).

9. The method according to claim 1, wherein the heat-resistant material has an uneven shape.

10. The method according to claim 9, wherein the heat-resistant material precipitates graphene on both a concave portion and a convex portion of the uneven shape.

11. The method according to claim 1, wherein the carbon-containing layer includes at least one kind selected from the group consisting of a carbon allotrope, a low-molecular organic compound, an artificial high-molecular organic compound, a natural high-molecular organic compound, and an inorganic compound containing carbon.

12. The method according to claim 11, wherein:

the carbon allotrope includes at least one selected from the group consisting of amorphous carbon, glassy carbon, crystalline graphite, a single-walled carbon nanotube, a multi-walled carbon nanotube, fullerene, diamond, and nanodiamond;

the low-molecular organic compound includes at least one selected from the group consisting of a metallocene, naphthalene, anthracene, and pentacene;

the artificial high-molecular organic compound includes at least one polymer selected from the group consisting of Teflon, polymethyl methacrylate (PMMA), and polyethylene;

the natural high-molecular organic compound includes at least one selected from the group consisting of a protein, a nucleic acid, a lipid, and a polysaccharide; and the inorganic compound containing carbon includes at least one selected from the group consisting of silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), tungsten carbide (WC), carbon nitride ($C_3N_4$), and boron carbon nitride (BCN).

13. The method according to claim 1, wherein:

(a) comprises heating at a temperature of 600° C. or more; and (b) comprises cooling to 400° C. at a temperature drop per unit time of 100° C./min or less to keep the metal layer at the constant temperature between 400° C. and 600° C.

14. A method of manufacturing a graphene substrate, comprising:

(a) bringing a metal layer into contact with a carbon-containing layer and heating the metal layer to dissolve carbon in the carbon-containing layer into the metal layer; and (b) cooling the metal layer to precipitate the carbon in the metal layer as graphene on a surface of a heat-resistant material brought into contact with the metal layer, wherein (a) comprises dissolving the carbon in the carbon-containing layer into the metal layer by arranging the carbon-containing layer in a holder, arranging a spacer on the carbon-containing layer, arranging the metal layer in the spacer, arranging a layer of the heat-resistant material on the metal layer, and heating the metal layer.

15. The method according to claim 9, wherein (b) comprises precipitating graphene only on the convex portion of the uneven shape.

16. The method according to claim 9, wherein the step (b) comprises precipitating graphene so that the graphene cross-links the convex portion of the uneven shape.

17. The method according to claim 13, wherein (b) comprises cooling to 400° C. at a temperature drop per unit time of from 0.5 to 100° C./min.

18. The method according to claim 1, wherein the carbon-containing layer includes one selected from the group consisting of a carbon allotrope, a low-molecular organic compound, an artificial high-molecular organic compound, a natural high-molecular organic compound, and an inorganic compound containing carbon, and wherein the carbon allotrope includes one selected from the group consisting of glassy carbon, crystalline graphite, single-walled and multi-walled carbon nanotubes, fullerene typified by $C_{60}$ and $C_{70}$, diamond, and nano diamond, the low-molecular organic compound includes one selected from the group consisting of a metallocene, naphthalene, anthracene, and pentacene, the artificial high-molecular organic compound includes one selected from the group consisting of Teflon (registered trademark), polymethyl methacrylate (PMMA), and polyethylene, the natural high-molecular organic compound includes one selected from the group consisting of a protein, a nucleic acid, a lipid, and a polysaccharide, and the inorganic compound containing carbon includes one selected from the group consisting of silicon carbide (SiC), boron carbide ($B_4C$), aluminum carbide ($Al_4C_3$), titanium carbide (TiC), zirconium carbide (ZrC), hafnium carbide (HfC), vanadium carbide (VC), niobium carbide (NbC), tantalum carbide (TaC), chromium carbide (CrC), molybdenum carbide (MoC), tungsten carbide (WC), carbon nitride ($C_3N_4$), and boron carbon nitride (BCN).

* * * * *

UNITED STATES PATENT AND TRADEMARK OFFICE
CERTIFICATE OF CORRECTION

PATENT NO. : 8,980,217 B2
APPLICATION NO. : 13/995809
DATED : March 17, 2015
INVENTOR(S) : Hidefumi Hiura and Kazuhito Tsukagoshi Page 1 of 1

It is certified that error appears in the above-identified patent and that said Letters Patent is hereby corrected as shown below:

In the Specification

Column 2, Line 34: Delete "minor" and insert -- mirror --

Signed and Sealed this
Seventeenth Day of November, 2015

Michelle K. Lee
*Director of the United States Patent and Trademark Office*